(12) United States Patent
Murashige et al.

(10) Patent No.: US 10,809,433 B2
(45) Date of Patent: Oct. 20, 2020

(54) CIRCULARLY POLARIZING PLATE FOR ORGANIC EL DISPLAY DEVICE, AND ORGANIC EL DISPLAY DEVICE

(71) Applicant: NITTO DENKO CORPORATION, Ibaraki-shi, Osaka (JP)

(72) Inventors: Takeshi Murashige, Ibaraki (JP); Junichi Inagaki, Ibaraki (JP); Kazuhito Hosokawa, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 279 days.

(21) Appl. No.: 15/743,021

(22) PCT Filed: Jul. 12, 2016

(86) PCT No.: PCT/JP2016/070588
§ 371 (c)(1),
(2) Date: Jan. 9, 2018

(87) PCT Pub. No.: WO2017/010485
PCT Pub. Date: Jan. 19, 2017

(65) Prior Publication Data
US 2019/0072701 A1    Mar. 7, 2019

(30) Foreign Application Priority Data
Jul. 13, 2015   (JP) .................................. 2015-139447

(51) Int. Cl.
*G02B 5/30*   (2006.01)
*H01L 51/50*   (2006.01)
(Continued)

(52) U.S. Cl.
CPC .............. *G02B 5/3083* (2013.01); *B32B 7/12* (2013.01); *B32B 17/064* (2013.01);
(Continued)

(58) Field of Classification Search
CPC .......... G02B 5/3083; G02B 5/30; G02B 5/32; H01L 51/50; H01L 51/5012;
(Continued)

(56) References Cited

U.S. PATENT DOCUMENTS 6,565,974 B1   5/2003   Uchiyama et al.
7,067,985 B2   6/2006   Adachi
(Continued)

FOREIGN PATENT DOCUMENTS

JP   3325560 B2   9/2002
JP   2002-311239 A   10/2002
(Continued)

OTHER PUBLICATIONS

International Search Report dated Oct. 18, 2016, issued in counterpart application No. PCT/JP2016/070588, w/English translation. (5 pages).
(Continued)

*Primary Examiner* — William R Alexander
*Assistant Examiner* — Henry A Duong
(74) *Attorney, Agent, or Firm* — Westerman, Hattori, Daniels & Adrian, LLP

(57) ABSTRACT

Provided is a circularly polarizing plate for an organic EL display apparatus, which has a high barrier function, is extremely thin, and has an excellent antireflection function. The circularly polarizing plate for an organic EL display apparatus of the present invention includes in this order: a polarizer; a retardation layer, which is configured to function as a $\lambda/4$ plate; a barrier layer; and a pressure-sensitive adhesive layer, which has a barrier function, in which the barrier layer includes thin glass having a thickness of from 5 μm to 100 μm.

4 Claims, 1 Drawing Sheet

(51) Int. Cl.
  *H05B 33/02*    (2006.01)
  *B32B 17/10*    (2006.01)
  *B32B 7/12*     (2006.01)
  *B32B 23/04*    (2006.01)
  *B32B 27/08*    (2006.01)
  *B32B 27/36*    (2006.01)
  *B32B 27/30*    (2006.01)
  *B32B 17/06*    (2006.01)
  *H01L 51/52*    (2006.01)
  *C09J 7/38*     (2018.01)

(52) U.S. Cl.
  CPC ...... *B32B 17/10018* (2013.01); *B32B 23/046* (2013.01); *B32B 27/08* (2013.01); *B32B 27/306* (2013.01); *B32B 27/36* (2013.01); *G02B 5/30* (2013.01); *H01L 51/50* (2013.01); *H01L 51/5012* (2013.01); *H01L 51/5281* (2013.01); *H05B 33/02* (2013.01); *B32B 2255/04* (2013.01); *B32B 2255/10* (2013.01); *B32B 2255/26* (2013.01); *B32B 2307/40* (2013.01); *B32B 2307/732* (2013.01); *B32B 2329/04* (2013.01); *B32B 2457/00* (2013.01); *B32B 2457/20* (2013.01); *C09J 7/38* (2018.01)

(58) Field of Classification Search
  CPC ............. H01L 51/5281; H01L 27/3232; H01L 51/5246; H01L 51/5293; H05B 33/02; B32B 17/10018; B32B 7/12; B32B 23/046; B32B 27/08; B32B 27/36; B32B 27/306; B32B 17/064; B32B 2307/732; B32B 2255/04; B32B 2457/20; B32B 2255/26; B32B 2255/10; B32B 2457/00; B32B 2329/04; B32B 2307/40; C09J 7/38; G02F 1/13363
  USPC ..................................................... 359/489.07
  See application file for complete search history.

(56) References Cited

U.S. PATENT DOCUMENTS

| | | | |
|---|---|---|---|
| RE39,753 E | 7/2007 | Uchiyama et al. | |
| 7,425,794 B2 | 9/2008 | Adachi | |
| 7,557,494 B2 | 7/2009 | Adachi | |
| 7,928,639 B2 | 4/2011 | Adachi | |
| 8,198,804 B2 | 6/2012 | Adachi | |
| 9,857,633 B2 | 1/2018 | Toyoshima et al. | |
| 10,209,567 B2 | 2/2019 | Toyoshima et al. | |
| 2004/0051445 A1 | 3/2004 | Adachi | |
| 2006/0028146 A1 | 2/2006 | Adachi | |
| 2008/0007155 A1 | 1/2008 | Adachi | |
| 2008/0137187 A1 | 6/2008 | Nishida et al. | |
| 2008/0310020 A1 | 12/2008 | Hashimoto et al. | |
| 2009/0072731 A1 | 3/2009 | Adachi | |
| 2011/0163333 A1 | 7/2011 | Adachi | |
| 2013/0038201 A1* | 2/2013 | Fukuda | H01L 51/5281 313/483 |
| 2013/0330550 A1 | 12/2013 | Toyama et al. | |
| 2015/0146294 A1 | 5/2015 | Watanabe | |
| 2015/0299518 A1 | 10/2015 | Nishijima et al. | |
| 2015/0338563 A1* | 11/2015 | Kiuchi | C07D 403/00 106/170.1 |
| 2016/0062510 A1 | 3/2016 | Tomohisa et al. | |
| 2016/0085100 A1 | 3/2016 | Toyoshima et al. | |
| 2016/0092005 A1* | 3/2016 | Toyoshima | B32B 27/365 345/174 |
| 2016/0130478 A1 | 5/2016 | Nagata et al. | |
| 2018/0107043 A1 | 4/2018 | Toyoshima et al. | |
| 2018/0284332 A1 | 10/2018 | Murashige et al. | |
| 2019/0171051 A1 | 6/2019 | Toyoshima et al. | |

FOREIGN PATENT DOCUMENTS

| | | | |
|---|---|---|---|
| JP | 2002-372622 A | | 12/2002 |
| JP | 2003-311239 A | | 11/2003 |
| JP | 2004-30955 A | | 1/2004 |
| JP | 2004-79432 A | | 3/2004 |
| JP | 2004079432 A | * | 3/2004 |
| JP | 2010-221716 A | | 10/2010 |
| JP | 2011-60604 A | | 3/2011 |
| JP | 2013-253202 A | | 12/2013 |
| TW | 200912402 A | | 3/2009 |
| TW | 201447921 A | | 12/2014 |
| TW | 201502937 A | | 1/2015 |
| WO | 2006/075736 A1 | | 7/2006 |
| WO | 2011/030879 A1 | | 3/2011 |
| WO | 2013/031364 A1 | | 3/2013 |
| WO | 2013/175767 A1 | | 11/2013 |
| WO | 2014/084044 A1 | | 6/2014 |
| WO | 2014/084046 A1 | | 6/2014 |
| WO | 2014/084350 A1 | | 6/2014 |
| WO | 2014084045 A1 | | 6/2014 |
| WO | 2014/171503 A1 | | 10/2014 |
| WO | 2014/171504 A1 | | 10/2014 |
| WO | 2014/185000 A1 | | 11/2014 |
| WO | 2014/208695 A1 | | 12/2014 |
| WO | 2016/080431 A1 | | 5/2016 |

OTHER PUBLICATIONS

Extended Search Report dated Jan. 3, 2019, issued in counterpart EP Application No. 16824465.5 (6 pages).
Office Action dated Dec. 21, 2018, issued in counterpart KR Application No. 10-2018-7001084, with English translation (11 pages).
Office Action dated Oct. 24, 2019, issued in counterpart KR application No. 10-2018-7001084, with English translation. (12 pages).
Office Action dated Dec. 19, 2019, issued in counterpart TW Application No. 105122105, with English translation (9 pages).
Office Action dated Jun. 17, 2020, issued in counterpart TW Application No. 105122105, with English translation (9 pages).

* cited by examiner

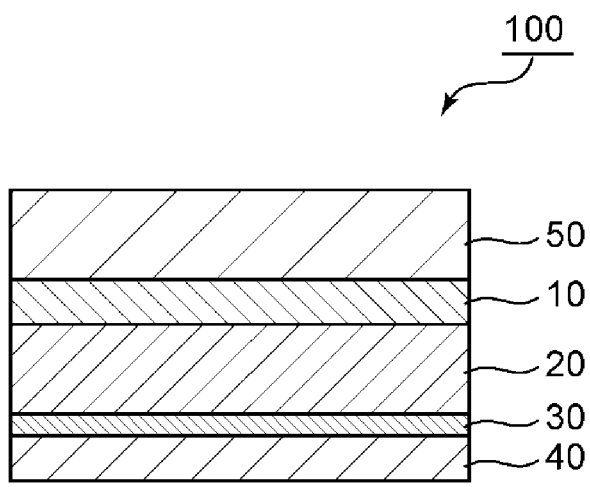

CIRCULARLY POLARIZING PLATE FOR ORGANIC EL DISPLAY DEVICE, AND ORGANIC EL DISPLAY DEVICE

TECHNICAL FIELD

The present invention relates to a circularly polarizing plate for an organic EL display apparatus and an organic EL display apparatus.

BACKGROUND ART

In recent years, a display mounted with an organic EL panel (an organic EL display apparatus) has been proposed in association with widespread use of a thin display. The organic EL panel is liable to cause problems, such as ambient light reflection and background reflection, because the panel includes a metal layer having high reflectivity. In view of the foregoing, it has been known that those problems are prevented by arranging a circularly polarizing plate on a viewer side (e.g., Patent Literatures 1 to 3).

The organic EL panel is extremely weak against moisture and oxygen in the air, and hence a barrier layer (barrier film) is typically arranged on the surface of the organic EL panel. Recently, in particular, there has been a growing demand for the impartment of a high barrier function to the circularly polarizing plate. Meanwhile, further thinning of the circularly polarizing plate has also been continuously demanded.

CITATION LIST

Patent Literature

[PTL 1] JP 2003-311239 A
[PTL 2] JP 2002-372622 A
[PTL 3] JP 3325560 B2

SUMMARY OF INVENTION

Technical Problem

The present invention has been made to solve the conventional problems, and a primary object of the present invention is to provide a circularly polarizing plate for an organic EL display apparatus, which has a high barrier function, is extremely thin, and has an excellent antireflection function.

Solution to Problem

According to one embodiment of the present invention, there is provided a circularly polarizing plate for an organic EL display apparatus, including in this order: a polarizer; a retardation layer, which is configured to function as a λ/4 plate; a barrier layer; and a pressure-sensitive adhesive layer, which has a barrier function, in which the barrier layer includes thin glass having a thickness of from 5 μm to 100 μm.

In one embodiment, the circularly polarizing plate for an organic EL display apparatus further includes a conductive layer or an isotropic substrate with a conductive layer between the barrier layer and the pressure-sensitive adhesive layer.

In one embodiment, the circularly polarizing plate for an organic EL display apparatus further includes a conductive layer or an isotropic substrate with a conductive layer between the retardation layer and the barrier layer.

According to another embodiment of the present invention, there is provided an organic EL display apparatus. The organic EL display apparatus includes the circularly polarizing plate for an organic EL display apparatus.

Advantageous Effects of Invention

According to the present invention, in the circularly polarizing plate for an organic EL display apparatus, the thin glass having a small thickness is adopted as the barrier layer. Consequently, a high barrier function can be expressed, and besides, the thickness of the circularly polarizing plate for an organic EL display apparatus can be extremely reduced. Moreover, satisfactory bending property can be expressed. In addition, according to the present invention, the barrier layer can be formed while the optical characteristics and mechanical characteristics of the retardation film (retardation layer) are maintained within desired ranges, and hence, in addition to the above-mentioned effects, an excellent antireflection function can also be expressed.

BRIEF DESCRIPTION OF DRAWINGS

FIG. 1 is a schematic sectional view of a circularly polarizing plate according to one embodiment of the present invention.

DESCRIPTION OF EMBODIMENTS

Preferred embodiments of the present invention are described below. However, the present invention is not limited to these embodiments.

Definitions of Terms and Symbols

The definitions of terms and symbols used herein are as described below.

(1) Refractive Indices ($n_x$, $n_y$, and $n_z$)

"$n_x$" represents a refractive index in a direction in which an in-plane refractive index is maximum (that is, slow axis direction), "$n_y$" represents a refractive index in a direction perpendicular to the slow axis in the plane (that is, fast axis direction), and "$n_z$" represents a refractive index in a thickness direction.

(2) In-Plane Retardation (Re)

"Re ($\lambda$)" refers to an in-plane retardation measured at 23° C. with light having a wavelength of λ nm. For example, "Re (550)" refers to an in-plane retardation measured at 23° C. with light having a wavelength of 550 nm. The Re ($\lambda$) is determined from the equation "Re=$(n_x - n_y) \times d$" when the thickness of a layer (film) is represented by d (nm).

(3) Thickness Direction Retardation (Rth)

"Rth ($\lambda$)" refers to a thickness direction retardation measured at 23° C. with light having a wavelength of λ nm. For example, "Rth (550)" refers to a thickness direction retardation measured at 23° C. with light having a wavelength of 550 nm. The Rth ($\lambda$) is determined from the equation "Rth=$(n_x - n_z) \times d$" when the thickness of a layer (film) is represented by d (nm).

(4) Nz Coefficient

An Nz coefficient is determined from the equation "Nz=Rth/Re".

A. Circularly Polarizing Plate for Organic EL Display Apparatus

A-1. Entire Construction of Circularly Polarizing Plate for Organic EL Display Apparatus A circularly polarizing plate for an organic EL display apparatus according to one embodiment of the present invention is used in an organic EL display apparatus. A circularly polarizing plate for an organic EL display apparatus according to one embodiment of the present invention includes in this order: a polarizer; a retardation layer, which is configured to function as a λ/4 plate; a barrier layer; and a pressure-sensitive adhesive layer, which has a barrier function. The entire construction of the circularly polarizing plate for an organic EL display apparatus is hereinafter specifically described, and then the respective layers and optical films constituting the circularly polarizing plate for an organic EL display apparatus are described in detail.

FIG. 1 is a schematic sectional view of a circularly polarizing plate for an organic EL display apparatus according to one embodiment of the present invention. A circularly polarizing plate 100 for an organic EL display apparatus of this embodiment includes in this order: a polarizer 10; a retardation layer 20; a barrier layer 30; and a pressure-sensitive adhesive layer 40. As described above, the retardation layer 20 functions as a λ/4 plate and the pressure-sensitive adhesive layer 40 has a barrier function. In FIG. 1, the circularly polarizing plate 100 for an organic EL display apparatus includes a protective film 50 on the side of the polarizer 10 opposite to the retardation layer 20. The circularly polarizing plate 100 for an organic EL display apparatus may include another protective film (sometimes referred to as "inner protective film": not shown) between the polarizer 10 and the retardation layer 20. In FIG. 1, the inner protective film is omitted. In this case, the retardation layer 20 can also function as the inner protective film. Such construction can achieve further thinning of the circularly polarizing plate for an organic EL display apparatus.

The circularly polarizing plate for an organic EL display apparatus of the present invention may include a λ/2 plate (not shown in FIG. 1) between the polarizer 10 and the retardation layer 20.

In one embodiment of the present invention, the circularly polarizing plate 100 for an organic EL display apparatus may include a conductive layer or an isotropic substrate with a conductive layer between the barrier layer 30 and the pressure-sensitive adhesive layer 40.

In one embodiment of the present invention, the circularly polarizing plate 100 for an organic EL display apparatus may include a conductive layer or an isotropic substrate with a conductive layer between the retardation layer 20 and the barrier layer 30.

In the present invention, an angle (angle α) formed between the absorption axis of the polarizer 10 and the slow axis of the retardation layer 20 is preferably from 35° to 55°, more preferably from 38° to 52°, still more preferably from 40° to 50°, particularly preferably from 42° to 48°, most preferably from 44° to 46°. When the angle α falls within such range, a desired circular polarization function can be achieved. When reference is made to an angle in this description, the angle includes angles in both clockwise and counterclockwise directions unless otherwise stated.

The circularly polarizing plate 100 for an organic EL display apparatus of the present invention has high barrier properties against moisture and a gas (e.g., oxygen). The water vapor barrier property (WVTR) of the circularly polarizing plate for an organic EL display apparatus of the present invention under the conditions of 60° C. and 90% RH is preferably $1.0 \times 10^{-4}$ g/m$^2$/24 hr or less, more preferably $1.0 \times 10-5$ g/m$^2$/24 hr or less, still more preferably $1.0 \times 10^{-6}$ g/m$^2$/24 hr or less. When the gas barrier property of the circularly polarizing plate for an organic EL display apparatus of the present invention under the conditions of 60° C. and 90% RH falls within such range, in the case where the circularly polarizing plate for an organic EL display apparatus of the present invention is bonded to an organic EL panel, the organic EL panel can be satisfactorily protected from moisture and oxygen in air.

A-2. Barrier Layer

In the present invention, the barrier layer 30 is thin glass having a thickness of from 5 μm to 100 μm. When the thin glass having a small thickness as described above is adopted as the barrier layer 30, the circularly polarizing plate for an organic EL display apparatus of the present invention can express a high barrier function, and besides, the thickness of the circularly polarizing plate for an organic EL display apparatus can be extremely reduced. Moreover, satisfactory bending property can be expressed. In addition, according to the present invention, the barrier layer can be formed while the optical characteristics and mechanical characteristics of the retardation film (retardation layer) are maintained within desired ranges, and hence, in addition to the above-mentioned effects, an excellent antireflection function can also be expressed.

Any appropriate thin glass may be adopted as the thin glass. According to classification based on composition, examples of such thin glass include soda-lime glass, borate glass, aluminosilicate glass, and quartz glass. In addition, according to classification based on an alkali component, examples of the thin glass include alkali-free glass and low-alkali glass. The content of an alkali metal component (e.g., Na$_2$O, K$_2$O, Li$_2$O) in the thin glass is preferably 15 wt % or less, more preferably 10 wt % or less.

The thickness of the thin glass is preferably from 10 μm to 100 μm, more preferably from 10 μm to 80 μm, still more preferably from 10 μm to 60 μm, still more preferably from 15 μm to 50 μm, particularly preferably from 15 μm to 40 μm, most preferably from 15 μm to 30 μm, because the effects of the present invention can be more effectively expressed. When the thin glass having a small thickness as described above is adopted, the circularly polarizing plate for an organic EL display apparatus of the present invention can express a high barrier function, and besides, the thickness of the circularly polarizing plate for an organic EL display apparatus can be extremely reduced. Moreover, satisfactory bending property can be expressed. In addition, according to the present invention, the barrier layer can be formed while the optical characteristics and mechanical characteristics of the retardation film (retardation layer) are maintained within desired ranges, and hence, in addition to the above-mentioned effects, an excellent antireflection function can also be expressed.

The thin glass preferably has a light transmittance at a wavelength of 550 nm of 85% or more. The thin glass preferably has a refractive index n, at a wavelength of 550 nm of from 1.4 to 1.65. With such thin glass, a circularly polarizing plate for an organic EL display apparatus more excellent in optical characteristics can be obtained.

The density of the thin glass is preferably from 2.3 g/cm$^3$ to 3.0 g/cm$^3$, more preferably from 2.3 g/cm$^3$ to 2.7 g/cm$^3$. With such thin glass, a lightweight circularly polarizing plate for an organic EL display apparatus can be obtained.

Any appropriate method may be adopted as a forming method for the thin glass. The thin glass is typically produced by melting a mixture containing a main raw material, such as silica or alumina, a fining agent, such as salt cake or antimony oxide, and a reducing agent, such as carbon, at a temperature of from 1,400° C. to 1,600° C., and forming the molten mixture into a thin plate shape, followed by cooling. As a thin plate-forming method for the thin glass, there are given, for example, a slot down-draw method, a fusion method, and a float method. The thin glass formed as a plate shape by any of those methods may be chemically polished with a solvent, such as hydrofluoric acid, as required, in order to reduce its thickness or enhance its smoothness.

As the thin glass, commercially available glass may be used as it is, or commercially available glass may be used after being polished so as to have a desired thickness. Examples of the commercially available glass include "7059", "1737", or "EAGLE 20000" manufactured by Corning Incorporated, "AN100" manufactured by Asahi Glass Co., Ltd., "NA-35" manufactured by NH Techno Glass Corporation, "OA-10" manufactured by Nippon Electric Glass Co., Ltd., and "D 263" or "AF 45" manufactured by Schott AG.

A surface of the thin glass may be subjected to coupling treatment.

Any appropriate method may be adopted as a method for the coupling treatment. A specific example of such method is a method involving applying a solution of a coupling agent to the surface of the thin glass, and then subjecting the resultant to heat treatment.

Any appropriate solvent may be used as a solvent to be used in the preparation of the solution of the coupling agent as long as the solvent does not react with the coupling agent. Specific examples of such solvent include: aliphatic hydrocarbon-based solvents, such as hexane and hexadecane; aromatic-based solvents, such as benzene, toluene, and xylene; halogenated hydrocarbon-based solvents, such as methylene chloride and 1,1,2-trichloroethane; ether-based solvents, such as tetrahydrofuran and 1,4-dioxane; alcohol-based solvents, such as methanol and propanol; ketone-based solvents, such as acetone and 2-butanone; and water.

Any appropriate heat treatment method may be adopted as a method for the heat treatment in the coupling treatment. Typically, a heat treatment temperature is from 50° C. to 15° C., and a heat treatment time is from 1 minute to 10 minutes.

The barrier layer 30 may be a single layer, or may include a plurality of layers.

The barrier layer 30 has high barrier properties against moisture and a gas (e.g., oxygen). The water vapor barrier property (WVTR) of the barrier layer 30 under the conditions of 60° C. and 90% RH is preferably $1.0 \times 10^{-6}$ g/m$^2$/24 hr or less, more preferably $1.0 \times 10^{-4}$ g/m$^2$/24 hr or less, still more preferably $1.0 \times 10^{-5}$ g/m$^2$/24 hr or less, particularly preferably $1.0 \times 10^{-6}$ g/m$^2$/24 hr or less. When the gas barrier property of the barrier layer 30 under the conditions of 60° C. and 90% RH falls within such range, in the case where the circularly polarizing plate for an organic EL display apparatus of the present invention is bonded to an organic EL panel, the organic EL panel can be satisfactorily protected from moisture and oxygen in air.

A-3. Polarizer

Any appropriate polarizer may be adopted as the polarizer 10. For example, a resin film for forming the polarizer may be a single-layer resin film, or may be a laminate of two or more layers.

Specific examples of the polarizer formed of a single-layer resin film include: a product obtained by subjecting a hydrophilic polymer film, such as a polyvinyl alcohol (PVA)-based film, a partially formalized PVA-based film, or an ethylene-vinyl acetate copolymer-based partially saponified film, to dyeing treatment with a dichromatic substance, such as iodine or a dichromatic dye, and stretching treatment; and a polyene-based alignment film, such as a dehydration-treated product of PVA or a dehydrochlorination-treated product of polyvinyl chloride. Of those, a polarizer obtained by dyeing a PVA-based film with iodine and uniaxially stretching the resultant is preferably used because of its excellent optical characteristics.

The dyeing with iodine is performed by, for example, immersing the PVA-based film in an aqueous solution of iodine. The stretching ratio of the uniaxial stretching is preferably from 3 times to 7 times. The stretching may be performed after the dyeing treatment or may be performed simultaneously with the dyeing. In addition, the stretching may be performed before the dyeing. The PVA-based film is subjected to, for example, swelling treatment, cross-linking treatment, washing treatment, or drying treatment as required. For example, when the PVA-based film is washed with water by being immersed in water before the dyeing, the soil or antiblocking agent on the surface of the PVA-based film can be washed off. In addition, the PVA-based film can be swollen to prevent dyeing unevenness or the like.

Specific examples of the polarizer obtained by using a laminate include: a polarizer obtained by using a laminate of a resin substrate and a PVA-based resin layer formed on the resin substrate through application; and a polarizer obtained by using a laminate formed by laminating a PVA-based resin film on a resin substrate. The polarizer obtained by using the laminate of the resin substrate and the PVA-based resin layer formed on the resin substrate through application may be produced by, for example, a method involving: applying a PVA-based resin solution to the resin substrate; drying the solution to form the PVA-based resin layer on the resin substrate, thereby providing the laminate of the resin substrate and the PVA-based resin layer; and stretching and dyeing the laminate to turn the PVA-based resin layer into the polarizer. In this embodiment, the stretching typically includes the stretching of the laminate under a state in which the laminate is immersed in an aqueous solution of boric acid. The stretching may further include the aerial stretching of the laminate at high temperature (e.g., 95° C. or more) before the stretching in the aqueous solution of boric acid as required. The resultant laminate of the resin substrate and the polarizer may be used as it is (i.e., the resin substrate may be used as a protective layer for the polarizer). Alternatively, a product obtained as described below may be used: the resin substrate is peeled from the laminate of the resin substrate and the polarizer, and any appropriate protective layer in accordance with purposes is laminated on the peeling surface. Details of such method of producing a polarizer are described in, for example, Japanese Patent Application Laid-open No. 2012-73580. The case in which the PVA-based resin layer is formed through application has been described above, but the same applies to the case in which the PVA-based resin film is laminated.

The thickness of the polarizer is typically from about 1 μm to about 80 μm.

A-4. Retardation Layer

As described above, the retardation layer 20 can function as a λ/4 plate. The in-plane retardation Re (550) of such retardation layer is from 100 nm to 180 nm, preferably from 110 nm to 170 nm, more preferably from 120 nm to 160 nm. The retardation layer 20 typically has a refractive index ellipsoid of nx>ny=nz or nx>ny>nz. In this description, for example, the expression "ny=nz" includes not only the case in which the ny and the nz are strictly equal to each other but also the case in which the ny and the nz are substantially equal to each other. Therefore, the Nz coefficient of the retardation layer 20 is, for example, from 0.9 to 1.3.

The thickness of the retardation layer may be set so that the layer may function as a λ/4 plate most appropriately. In other words, the thickness of the retardation layer may be set so that a desired in-plane retardation may be obtained. Specifically, the thickness of the retardation layer is preferably from 1 μm to 80 μm, more preferably from 10 μm to 60 μm, most preferably from 30 μm to 50 μm.

The retardation layer contains a resin having a photoelastic coefficient of preferably $-20 \times 10^{-12}$ $Pa^{-1}$ or more, more preferably $-10 \times 10^{-2}$ $Pa^{-1}$ or more, and of preferably $40 \times 10^{-12}$ $Pa^{-1}$ or less, more preferably $30 \times 10^{-12}$ $Pa^{-1}$ or less. When the photoelastic coefficient of the retardation layer falls within such range, a retardation change hardly occurs in the case where a shrinkage stress is generated at the time of heating. Therefore, when the retardation layer is formed using the resin having such photoelastic coefficient, heat unevenness in an organic EL display apparatus to be obtained can be satisfactorily prevented.

The retardation layer may show such a reverse wavelength dispersion characteristic that its retardation value increases in accordance with an increase in wavelength of measurement light, may show such a positive wavelength dispersion characteristic that the retardation value reduces in accordance with an increase in wavelength of the measurement light, or may show such a flat wavelength dispersion characteristic that the retardation value remains substantially unchanged even when the wavelength of the measurement light is changed. In the present invention, the retardation layer has preferably a reverse wavelength dispersion characteristic or a flat wavelength dispersion characteristic, more preferably a reverse wavelength dispersion characteristic. When a λ/4 plate having a reverse wavelength dispersion characteristic or a λ/4 plate having a flat wavelength dispersion characteristic is adopted as the retardation layer, an excellent antireflection characteristic and an excellent reflection hue in an oblique direction can be achieved.

When the λ/4 plate having a reverse wavelength dispersion characteristic is adopted as the retardation layer, the retardation layer preferably has a ratio Re(450)/Re(550) of 0.8 or more and less than 1, more preferably 0.8 or more and 0.95 or less.

When the λ/4 plate having a flat wavelength dispersion characteristic is adopted as the retardation layer, the retardation layer preferably has a ratio Re(450)/Re(550) of from 0.99 to 1.03, and preferably has a ratio Re(650)/Re(550) of from 0.98 to 1.02.

The retardation layer may include any appropriate resin film that can satisfy such optical characteristics and mechanical characteristics as described above. Typical examples of such resin include resins, for example, transparent resins, such as a cellulose-based resin, a polyester-based resin, a polyvinyl alcohol-based resin, a polyvinyl acetal-based resin, a polycarbonate-based resin, a polyamide-based resin, a polyimide-based resin, a polyether sulfone-based resin, a polyether-based resin, a polysulfone-based resin, a polystyrene-based resin, a polynorbornene-based resin, a polyolefin-based resin, an acrylic resin, a urethane-based resin, an acrylic urethane-based resin, and an acetate-based resin.

A-3-1. λ/4 Plate Having Reverse Wavelength Dispersion Characteristic

When the λ/4 plate having a reverse wavelength dispersion characteristic is adopted as the retardation layer, a resin for forming the retardation layer is preferably a polycarbonate resin.

In one embodiment of the present invention, the polycarbonate resin contains a structural unit derived from a dihydroxy compound represented by the general formula (1), a structural unit derived from a dihydroxy compound represented by the general formula (2), and a structural unit derived from at least one kind of dihydroxy compound selected from a dihydroxy compound represented by the general formula (3), a dihydroxy compound represented by the general formula (4), a dihydroxy compound represented by the general formula (5), and a dihydroxy compound represented by the general formula (6).

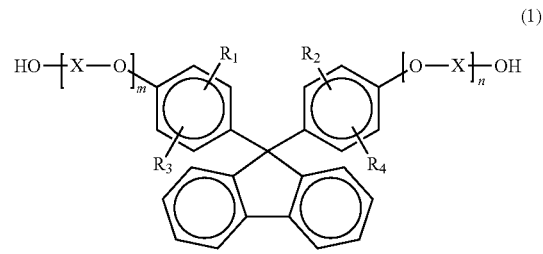
(1)

(In the general formula (1), $R_1$ to $R_4$ each independently represent a hydrogen atom, a substituted or unsubstituted alkyl group having 1 to 20 carbon atoms, a substituted or unsubstituted cycloalkyl group having 6 to 20 carbon atoms, or a substituted or unsubstituted aryl group having 6 to 20 carbon atoms, X represents a substituted or unsubstituted alkylene group having 2 to 10 carbon atoms, a substituted or unsubstituted cycloalkylene group having 6 to 20 carbon atoms, or a substituted or unsubstituted arylene group having 6 to 20 carbon atoms, and m and n each independently represent an integer of from 0 to 5.)

(2)

HO—$R_5$—OH (3)

(In the general formula (3), $R_5$ represents a substituted or unsubstituted cycloalkylene group of a monocyclic structure having 4 to 20 carbon atoms.)

HO—$CH_2$—$R_6$—$CH_2$—OH (4)

(In the general formula (4), $R_6$ represents a substituted or unsubstituted cycloalkylene group of a monocyclic structure having 4 to 20 carbon atoms.)

H—(O—$R_7$)$_P$—OH (5)

(In the general formula (5), $R_7$ represents a substituted or unsubstituted alkylene group having 2 to 10 carbon atoms, and p represents an integer of from 2 to 100.)

HO—$R_8$—OH (6)

(In the general formula (6), $R_8$ represents an alkyl group having 2 to 20 carbon atoms or a group represented by the formula (7).)

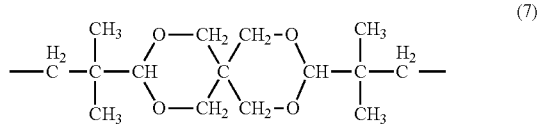

(7)

Specific examples of the dihydroxy compound represented by the general formula (1) include 9,9-bis(4-hydroxyphenyl) fluorene, 9,9-bis(4-hydroxy-3-methylphenyl)fluorene, 9,9-bis(4-hydroxy-3-ethylphenyl)fluorene, 9,9-bis(4-hydroxy-3-n-propylphenyl)fluorene, 9,9-bis(4-hydroxy-3-isopropylphenyl)fluorene, 9,9-bis(4-hydroxy-3-n-butylphenyl)fluorene, 9,9-bis(4-hydroxy-3-sec-butylphenyl) fluorene, 9,9-bis(4-hydroxy-3-tert-propylphenyl)fluorene, 9,9-bis(4-hydroxy-3-cyclohexylphenyl)fluorene, 9,9-bis(4-hydroxy-3-phenylphenyl)fluorene, 9,9-bis(4-(2-hydroxyethoxy)phenyl)fluorene, 9,9-bis(4-(2-hydroxyethoxy)-3-methylphenyl)fluorene, 9,9-bis(4-(2-hydroxyethoxy)-3-isopropylphenyl)fluorene, 9,9-bis(4-(2-hydroxyethoxy)-3-isobutylphenyl)fluorene, 9,9-bis(4-(2-hydroxyethoxy)-3-tert-butylphenyl)fluorene, 9,9-bis(4-(2-hydroxyethoxy)-3-cyclohexylphenyl)fluorene, 9,9-bis(4-(2-hydroxyethoxy)-3-phenylphenyl)fluorene, 9,9-bis(4-(2-hydroxyethoxy)-3,5-dimethylphenyl)fluorene, 9,9-bis(4-(2-hydroxyethoxy)-3-tert-butyl-6-methylphenyl)fluorene, and 9,9-bis(4-(3-hydroxy-2,2-dimethylpropoxy)phenyl) fluorene. Of those, 9,9-bis(4-hydroxy-3-methylphenyl)fluorene, 9,9-bis(4-(2-hydroxyethoxy)phenyl)fluorene, and 9,9-bis(4-(2-hydroxyethoxy)-3-methylphenyl)fluorene are preferred, and 9,9-bis(4-(2-hydroxyethoxy)phenyl)fluorene is particularly preferred. The dihydroxy compounds each represented by the general formula (1) may be used alone or in combination thereof.

Examples of the dihydroxy compound represented by the general formula (2) include isosorbide, isomannide, and isoiidide, which are in a stereoisomeric relationship. The dihydroxy compounds each represented by the general formula (2) may be used alone or in combination thereof. Of those, as the dihydroxy compound represented by the general formula (2), isosorbide obtained by dehydration condensation of sorbitol produced from various starches that are abundant as resources and are hence easily available is preferred in terms of the ease of availability and the ease of production, optical characteristics, and formability.

An example of the dihydroxy compound represented by the general formula (3) is a compound containing a cycloalkylene group of a monocyclic structure (alicyclic dihydroxy compound). When the monocyclic structure is adopted, the toughness of a film formed of the polycarbonate resin to be obtained can be improved. A typical example of the alicyclic dihydroxy compound is a compound containing a five-membered ring structure or a six-membered ring structure. With the five-membered ring structure or the six-membered ring structure, the heat resistance of the polycarbonate resin to be obtained can be increased. The six-membered ring structure may be fixed in a chair form or a boat form by a covalent bond. Specific examples of the dihydroxy compound represented by the general formula (3) include 1,2-cyclopentanediol, 1,3-cyclopentanediol, 1,2-cyclohexanediol, 1,3-cyclohexanediol, 1,4-cyclohexanediol, and 2-methyl-1,4-cyclohexanediol. The dihydroxy compounds each represented by the general formula (3) may be used alone or in combination thereof.

An example of the dihydroxy compound represented by the general formula (4) is a compound containing a cycloalkylene group of a monocyclic structure (alicyclic dihydroxy compound). When the monocyclic structure is adopted, the toughness of a film formed of the polycarbonate resin to be obtained can be improved. Typical examples of the alicyclic dihydroxy compound include various isomers in each of which $R_6$ in the general formula (4) is represented by the general formula (Ia), where $R_9$ represents a hydrogen atom, or a substituted or unsubstituted alkyl group having 1 to 12 carbon atoms. Preferred specific examples of such isomer include 1,2-cyclohexanedimethanol, 1,3-cyclohexanedimethanol, and 1,4-cyclohexanedimethanol. Those isomers are easily available and are excellent in handleability. The dihydroxy compounds each represented by the general formula (4) may be used alone or in combination thereof.

(Ia)

The compounds given above as examples of the dihydroxy compounds represented by the general formula (3) and the general formula (4) are examples of alicyclic dihydroxy compounds that may be used, and the dihydroxy compounds are by no means limited thereto.

Specific examples of the dihydroxy compound represented by the general formula (5) include diethylene glycol, triethylene glycol, and polyethylene glycol (molecular weight: from 150 to 2,000).

Specific examples of the dihydroxy compound represented by the general formula (6) include ethylene glycol, propylene glycol, 1,4-butanediol, 1,6-hexanediol, and a spiroglycol represented by the formula (8). Of those, propylene glycol, 1,4-butanediol, and a spiroglycol are preferred.

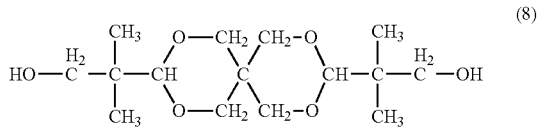

(8)

Of the structural unit derived from the dihydroxy compound represented by the general formula (3), the structural unit derived from the dihydroxy compound represented by the general formula (4), the structural unit derived from the dihydroxy compound represented by the general formula (5), and the structural unit derived from the dihydroxy compound represented by the general formula (6), the polycarbonate resin contains preferably the structural unit derived from the dihydroxy compound represented by the general formula (4) and/or the structural unit derived from the dihydroxy compound represented by the general formula (5), more preferably the structural unit derived from the dihydroxy compound represented by the general formula (5). When the polycarbonate resin contains the structural unit derived from the dihydroxy compound represented by the general formula (5), stretchability can be improved.

The polycarbonate resin may further contain structural units derived from other dihydroxy compounds. Examples of the other dihydroxy compounds include bisphenols. Examples of the bisphenols include 2,2-bis(4-hydroxyphenyl)propane[=bisphenol A], 2,2-bis(4-hydroxy-3,5-dimethylphenyl)propane, 2,2-bis(4-hydroxy-3,5-diethylphenyl)propane, 2,2-bis(4-hydroxy-(3,5-diphenyl)phenyl)propane, 2,2-bis(4-hydroxy-3,5-dibromophenyl)propane, 2,2-bis(4-hydroxyphenyl)pentane, 2,4'-dihydroxy-diphenylmethane, bis(4-hydroxyphenyl)methane, bis(4-hydroxy-5-nitrophenyl)methane, 1,1-bis(4-hydroxyphenyl)ethane, 3,3-bis(4-hydroxyphenyl)pentane, 1,1-bis(4-hydroxyphenyl)cyclohexane, bis(4-hydroxyphenyl) sulfone, 2,4'-dihydroxydiphenyl sulfone, bis(4-hydroxyphenyl) sulfide, 4,4'-dihydroxydiphenyl ether, 4,4'-dihydroxy-3,3'-dichlorodiphenyl ether, and 4,4'-dihydroxy-2,5-diethoxydiphenyl ether.

The content ratio of the structural unit derived from the dihydroxy compound represented by the general formula (1) in the polycarbonate resin is preferably 18 mol % or more, more preferably 20 mol % or more, still more preferably 25 mol % or more. When the content ratio falls within the range, satisfactory reverse wavelength dispersion dependency can be obtained. When the content ratio is excessively small, there is a risk in that the reverse wavelength dispersion dependency may not be obtained.

The content ratio of the structural unit derived from at least one kind of dihydroxy compound selected from the dihydroxy compound represented by the general formula (3), the dihydroxy compound represented by the general formula (4), the dihydroxy compound represented by the general formula (5), and the dihydroxy compound represented by the general formula (6) in the polycarbonate resin is preferably 25 mol % or more, more preferably 30 mol % or more, still more preferably 35 mol % or more. When the content ratio falls within the range, the toughness of a film formed of the polycarbonate resin to be obtained can be more effectively expressed. When the content ratio is excessively small, there is a risk in that the toughness of the film formed of the polycarbonate resin to be obtained may be poor.

The glass transition temperature of the polycarbonate resin is preferably from 110° C. to 150° C., more preferably from 120° C. to 140° C. or less. When the glass transition temperature falls within the range, the heat resistance of the polycarbonate resin can be sufficiently secured, the dimensional change of the polycarbonate resin after its forming into a film can be suppressed, the image quality of an organic EL panel to be obtained can be improved, forming stability at the time of the forming of the polycarbonate resin into a film can be enhanced, and the transparency of a film formed of the polycarbonate resin can be improved. When the glass transition temperature is excessively low, there are risks in that: the heat resistance of the polycarbonate resin may deteriorate; the polycarbonate resin may cause a dimensional change after its forming into a film; and the image quality of the organic EL panel to be obtained may be lowered. When the glass transition temperature is excessively high, there are risks in that: the forming stability at the time of the forming into a film may deteriorate; and the transparency of the film may be impaired. The glass transition temperature is determined in conformity with JIS K 7121 (1987).

The molecular weight of the polycarbonate resin may be expressed as a reduced viscosity. The reduced viscosity is measured with an Ubbelohde viscometer at a temperature of 20.0° C.±0.1° C. after precise adjustment of a polycarbonate concentration to 0.6 g/dL through the use of methylene chloride as a solvent. A lower limit value for the reduced viscosity is preferably 0.30 dL/g, more preferably 0.35 dL/g or more. An upper limit value for the reduced viscosity is preferably 1.20 dL/g, more preferably 1.00 dL/g, still more preferably 0.80 dL/g. When the upper limit value and lower limit value for the reduced viscosity fall within the range, the mechanical strength of a formed product can be sufficiently secured. Besides, fluidity during forming can be secured, and hence productivity and formability can be improved. When the reduced viscosity is lower than the lower limit value, there is a risk in that a problem may occur in that the mechanical strength of the formed product is reduced. When the reduced viscosity is higher than the upper limit value, there is a risk in that a problem may occur in that the fluidity during forming may be decreased to decrease the productivity and the formability.

The retardation layer is typically produced by stretching a resin film in at least one direction.

Any appropriate method may be adopted as a method of forming the resin film. Examples thereof include a melt extrusion method (e.g., a T-die molding method), a cast coating method (e.g., a casting method), a calender molding method, a hot-press method, a co-extrusion method, a co-melting method, multilayer extrusion, and an inflation molding method. Of those, a T-die molding method, a casting method, and an inflation molding method are preferred.

The thickness of the resin film (unstretched film) may be set to any appropriate value depending on, for example, desired optical characteristics, and stretching conditions to be described later. The thickness of such resin film (unstretched film) is preferably from 50 μm to 300 μm.

Any appropriate stretching method and stretching conditions (such as a stretching temperature, a stretching ratio, and a stretching direction) may be adopted for the stretching. Specifically, various stretching methods, such as free-end stretching, fixed-end stretching, free-end shrinkage, and fixed-end shrinkage, may be used alone, or may be used simultaneously or sequentially. With regard to a stretching direction, the stretching may be performed in various directions or dimensions, such as a horizontal direction, a vertical direction, a thickness direction, and a diagonal direction. When the glass transition temperature of the resin film is represented by Tg, the stretching temperature falls within a range of preferably from Tg−30° C. to Tg+60° C., more preferably from Tg−10° C. to Tg+50° C.

A retardation layer having the desired optical characteristics (such as a refractive index characteristic, an in-plane retardation, and an Nz coefficient) may be obtained by appropriately selecting the stretching method and stretching conditions.

In one embodiment, the retardation layer is produced by subjecting a resin film to uniaxial stretching or fixed-end uniaxial stretching. The fixed-end uniaxial stretching is specifically, for example, a method involving stretching the resin film in its widthwise direction (lateral direction) while running the resin film in its lengthwise direction. The stretching ratio is preferably from 1.1 times to 3.5 times.

In one embodiment, the retardation layer is produced by obliquely stretching an elongate resin film in a direction of the angle θ relative to its lengthwise direction in a continuous manner. When the oblique stretching is adopted, an elongate stretched film having an alignment angle that is the angle θ relative to the lengthwise direction of the film (i.e., having a slow axis in a direction of the angle θ) is obtained.

As a result, for example, a roll-to-roll process can be performed at the time of its lamination with the polarizer, and hence a production process can be simplified.

As a stretching machine to be used for the oblique stretching, there is given, for example, a tenter stretching machine capable of applying feeding forces, or tensile forces or take-up forces, having different speeds on left and right sides in a lateral direction and/or a longitudinal direction. Examples of the tenter stretching machine include a lateral uniaxial stretching machine and a simultaneous biaxial stretching machine, and any appropriate stretching machine may be used as long as the elongate resin film can be continuously subjected to the oblique stretching.

The thickness of the retardation layer (stretched film) is preferably from 20 μm to 100 μm, more preferably from 30 μm to 80 μm, still more preferably from 30 μm to 65 μm.

A-3-2. λ/4 Plate Having Flat Wavelength Dispersion Characteristic

When the λ/4 plate having a flat wavelength dispersion characteristic is adopted as the retardation layer 20, a resin for forming the retardation layer 20 is preferably a polycarbonate resin.

In one embodiment of the present invention, the polycarbonate resin contains at least a constituent unit derived from a dihydroxy compound having a bond structure represented by the structural formula (9), and is produced by causing a dihydroxy compound including at least a dihydroxy compound having at least one bond structure "—CH$_2$—O—" in a molecule thereof and a carbonic acid diester to react with each other in the presence of a polymerization catalyst.

(9)

A compound of any structure may be used as the dihydroxy compound having a bond structure represented by the structural formula (9) as long as the compound has two alcoholic hydroxy groups, contains a structure having a linking group "—CH$_2$—O—" in a molecule thereof, and can react with the carbonic acid diester in the presence of the polymerization catalyst to produce the polycarbonate resin. Two or more kinds of such compounds may be used in combination. In addition, a dihydroxy compound free of any bond structure represented by the structural formula (9) may be used as a dihydroxy compound to be used in the polycarbonate resin in combination with the above-mentioned dihydroxy compound. The dihydroxy compound having a bond structure represented by the structural formula (9) is hereinafter abbreviated as "dihydroxy compound (A)" and the dihydroxy compound free of any bond structure represented by the structural formula (9) is abbreviated as "dihydroxy compound (B)" in some cases.

<Dihydroxy Compound (A)>

The linking group "—CH$_2$—O—" in the dihydroxy compound (A) means a structure that is bonded to an atom except a hydrogen atom to constitute a molecule. An atom to which at least an oxygen atom in the linking group can be bonded, or each of atoms to which a carbon atom and the oxygen atom therein can be simultaneously bonded, is preferably a carbon atom. The number of the linking groups "—CH$_2$—O—" in the dihydroxy compound (A) is 1 or more, preferably from 2 to 4.

More specific examples of the dihydroxy compound (A) include: compounds each having an aromatic group in a side chain and an ether group bonded to an aromatic group in a main chain, such as 9,9-bis(4-(2-hydroxyethoxy)phenyl) fluorene, 9,9-bis(4-(2-hydroxyethoxy)-3-methylphenyl) fluorene, 9,9-bis(4-(2-hydroxyethoxy)-3-isopropylphenyl) fluorene, 9,9-bis(4-(2-hydroxyethoxy)-3-isobutylphenyl) fluorene, 9,9-bis(4-(2-hydroxyethoxy)-3-tert-butylphenyl) fluorene, 9,9-bis(4-(2-hydroxyethoxy)-3-cyclohexylphenyl) fluorene, 9,9-bis(4-(2-hydroxyethoxy)-3-phenylphenyl) fluorene, 9,9-bis(4-(2-hydroxyethoxy)-3,5-dimethylphenyl) fluorene, 9,9-bis(4-(2-hydroxyethoxy)-3-tert-butyl-6-methylphenyl)fluorene, and 9,9-bis(4-(3-hydroxy-2,2-dimethylpropoxy)phenyl)fluorene; bis(hydroxyalkoxyaryl) alkanes, such as bis[4-(2-hydroxyethoxy)phenyl]methane, bis[4-(2-hydroxyethoxy)phenyl]diphenylmethane, 1,1-bis [4-(2-hydroxyethoxy)phenyl]ethane, 1,1-bis[4-(2-hydroxyethoxy)phenyl]-1-phenylethane, 2,2-bis[4-(2-hydroxyethoxy)phenyl]propane, 2,2-bis[4-(2-hydroxyethoxy)-3-methylphenyl]propane, 2,2-bis[3,5-dimethyl-4-(2-hydroxyethoxy)phenyl]propane, 1,1-bis[4-(2-hydroxyethoxy)phenyl]-3,3,5-trimethylcyclohexane, 1,1-bis [4-(2-hydroxyethoxy)phenyl]cyclohexane, 1,4-bis[4-(2-hydroxyethoxy)phenyl]cyclohexane, 1,3-bis[4-(2-hydroxyethoxy)phenyl]cyclohexane, 2,2-bis[4-(2-hydroxyethoxy)-3-phenylphenyl]propane, 2,2-bis[(2-hydroxyethoxy)-3-isopropylphenyl]propane, 2,2-bis[3-tert-butyl-4-(2-hydroxyethoxy)phenyl]propane, 2,2-bis[4-(2-hydroxyethoxy)phenyl]butane, 2,2-bis[4-(2-hydroxyethoxy)phenyl]-4-methylpentane, 2,2-bis[4-(2-hydroxyethoxy)phenyl]octane, 1,1-bis[4-(2-hydroxyethoxy) phenyl]decane, 2,2-bis[3-bromo-4-(2-hydroxyethoxy) phenyl]propane, and 2,2-bis[3-cyclohexyl-4-(2-hydroxyethoxy)phenyl]propane; bis(hydroxyalkoxyaryl) cycloalkanes, such as 1,1-bis[4-(2-hydroxyethoxy)phenyl] cyclohexane, 1,1-bis[3-cyclohexyl-4-(2-hydroxyethoxy) phenyl]cyclohexane, and 1,1-bis[4-(2-hydroxyethoxy) phenyl]cyclopentane; dihydroxyalkoxydiaryl ethers, such as 4,4'-bis(2-hydroxyethoxy)diphenyl ether and 4,4'-bis(2-hydroxyethoxy)-3,3'-dimethyl diphenyl ether; bishydroxyalkoxyaryl sulfides, such as 4,4'-bis(2-hydroxyethoxyphenyl) sulfide and 4,4'-bis[4-(2-dihydroxyethoxy)-3-methylphenyl]sulfide; bishydroxyalkoxyaryl sulfoxides, such as 4,4'-bis(2-hydroxyethoxyphenyl) sulfoxide and 4,4'-bis[4-(2-dihydroxyethoxy)-3-methylphenyl]sulfoxide; bishydroxyalkoxyaryl sulfones, such as 4,4'-bis(2-hydroxyethoxyphenyl) sulfone and 4,4'-bis[4-(2-dihydroxyethoxy)-3-methylphenyl]sulfone; and 1,4-bishydroxyethoxybenzene, 1,3-bishydroxyethoxybenzene, 1,2-bishydroxyethoxybenzene, 1,3-bis[2-[4-(2-hydroxyethoxy)phenyl]propyl]benzene, 1,4-bis[2-[4-(2-hydroxyethoxy)phenyl]propyl]benzene, 4,4'-bis(2-hydroxyethoxy) biphenyl, 1,3-bis[4-(2-hydroxyethoxy)phenyl]-5,7-dimethyladamantane, and anhydrous sugar alcohols typified by the dihydroxy compound represented by the general formula (2); and compounds each having a cyclic ether structure, such as the spiroglycol represented by the formula (8). The dihydroxy compounds (A) may be used alone or in combination thereof.

Examples of the dihydroxy compound represented by the general formula (2) include isosorbide, isomannide, and isoidide, which are in a stereoisomeric relationship. The dihydroxy compounds each represented by the general formula (2) may be used alone or in combination thereof. Of those, as the dihydroxy compound represented by the general formula (2), isosorbide obtained by dehydration condensation of sorbitol produced from various starches that are abundant as resources and are hence easily available is preferred in terms of the ease of availability and the ease of production, optical characteristics, and formability.

Isosorbide is liable to be gradually oxidized by oxygen. Accordingly, it is important that when the isosorbide is stored or handled at the time of the production of the polycarbonate resin, a deoxidant be used or a nitrogen atmosphere be established for preventing its decomposition due to oxygen. In addition, it is necessary that moisture be prevented from being included in the isosorbide. The oxidation of the isosorbide produces decomposition products typified by formic acid. For example, when the polycarbonate resin is produced by using isosorbide containing those decomposition products, the decomposition products are responsible for the occurrence of the coloring of the polycarbonate resin to be obtained or for remarkable deterioration of its physical properties. In addition, the decomposition products affect a polymerization reaction and hence a polymer having a high molecular weight is not obtained in some cases.

Further, when a stabilizer that prevents the occurrence of formic acid is added to isosorbide, depending on the kind of the stabilizer, the coloring of the polycarbonate resin to be obtained occurs or its physical properties are remarkably deteriorated in some cases. A reducing agent or an antacid is used as the stabilizer. Of those, the reducing agent is, for example, sodium borohydride or lithium borohydride, and the antacid is, for example, sodium hydroxide. However, when such alkali metal salt is added, its alkali metal also serves as a polymerization catalyst. Accordingly, excessive addition of the salt may preclude the control of the polymerization reaction.

In order to obtain isosorbide free of any oxidative decomposition product, isosorbide may be distilled as required. In addition, also in the case where a stabilizer is compounded for preventing the oxidation or decomposition of the isosorbide, the isosorbide may be distilled as required in order that the stabilizer may be removed. In this case, the distillation of the isosorbide may be simple distillation or may be continuous distillation, and is not particularly limited. With regard to the atmosphere under which the distillation is performed, after an inert gas atmosphere, such as argon or nitrogen, has been established, the distillation is performed under reduced pressure.

For example, when isosorbide is subjected to such distillation, its purity may be set to such a high value that its formic acid content is less than 20 ppm, preferably 10 ppm or less, more preferably 5 ppm or less, still more preferably 3 ppm or less, or the isosorbide is particularly preferably completely free of formic acid. Simultaneously, the purity may be set to such a high value that the content of an alkali metal compound and/or an alkaline earth metal compound with respect to 1 mol of the isosorbide is 10 µmol or less, preferably 5 µmol or less, more preferably 3 µmol or less, still more preferably 1 µmol or less in terms of a metal, or the isosorbide is particularly preferably completely free of any alkali metal compound and/or any alkaline earth metal compound.

In the polycarbonate resin, the dihydroxy compound (A), such as the dihydroxy compound represented by the general formula (2), having a formic acid content of less than 20 ppm is preferably used. Further, the formic acid content is preferably 10 ppm or less, more preferably 5 ppm or less, still more preferably 3 ppm or less, or the dihydroxy compound (A) is particularly preferably completely free of formic acid produced by its decomposition or the like. When the dihydroxy compound (A), such as the dihydroxy compound represented by the general formula (2), having such high purity is used as a raw material, a problem in the polymerization reaction to be described later is solved, and hence a high-quality polycarbonate resin further suppressed in coloring and the like can be stably and efficiently produced.

As specific means for subjecting the dihydroxy compound (A), such as the dihydroxy compound represented by the general formula (2), having small contents of formic acid, and the alkali metal compound and/or the alkaline earth metal compound as described above to the reaction with the carbonic acid diester, for example, the following method may be adopted. That is, the dihydroxy compound (A), such as the dihydroxy compound represented by the general formula (2), having a high purity is preferably stored under an atmosphere where oxygen is absent, such as an inert gas atmosphere, or a reduced-pressure or vacuum atmosphere, until a time point immediately before the reaction with the carbonic acid diester. When the compound is stored under an environment at 40° C. and 80% RH after having been removed from the storage state, the compound is supplied to a reaction system with the carbonic acid diester preferably within 2 weeks, more preferably within 1 week. In the case of the storage under the environment at 40° C. and 80% RH, even when the dihydroxy compound represented by the general formula (2) is left to stand in air for preferably 2 weeks or less, more preferably 1 week or less, the polymerization is not inhibited. When the temperature and the humidity are less than 40° C. and 80% RH, respectively, the storage period can be lengthened.

The phrase "under the inert gas atmosphere" as used herein means, for example, that the compound is stored under an atmosphere containing one or more kinds of gases, such as nitrogen and argon, the atmosphere having an oxygen content of 1,000 ppm or less, especially an atmosphere completely free of oxygen, and the phrase "under the reduced-pressure atmosphere" means, for example, that the compound is stored under an atmosphere having a pressure of 13.3 kPa or less and an oxygen content of 100 ppm or less. In the storage system, a deoxidant using iron powder as a main component, specifically, a deoxidant, such as AGELESS (manufactured by Mitsubishi Gas Chemical Company, Inc.) or OXY-EATER (manufactured by Ueno Fine Chemicals Industry, Ltd.), or a drying agent, such as silica gel, a molecular sieve, or aluminum oxide, may be caused to coexist as required.

The oxidation of the dihydroxy compound (A), such as isosorbide, produces decomposition products typified by formic acid, and hence it is effective to store the compound at low temperature so that such decomposition products may not be produced. When the storage temperature is 40° C. or less, when an environment having an oxygen concentration of 1,000 ppm or less is maintained under an inert gas atmosphere by causing a deoxidant to coexist, the compound can be subjected to the polymerization for at least 1 month. The storage temperature is preferably 40° C. or less, more preferably 25° C. or less, still more preferably 10° C. or less, particularly preferably 5° C. or less.

Although powdery or flaky isosorbide can be stored under a humidity as high as 80% RH, its mass may change owing to moisture absorption. Accordingly, the isosorbide is preferably hermetically stored in an aluminum moisture barrier bag or the like, or stored under an inert gas atmosphere so as not to absorb moisture.

Those conditions may be appropriately used in combination.

When the dihydroxy compound (A), such as the dihydroxy compound represented by the general formula (2), is subjected to the reaction with the carbonic acid diester to be described later, the form of the compound is not particularly limited, and may be a powder form, may be a flake form, or may be a liquid form, such as a molten state or an aqueous solution.

<Dihydroxy Compound (B)>

In the polycarbonate resin, a dihydroxy compound (B), which is a dihydroxy compound except the dihydroxy compound (A), may be used as the dihydroxy compound. As the dihydroxy compound (B), for example, an alicyclic dihydroxy compound, an aliphatic dihydroxy compound, an oxyalkylene glycol, an aromatic dihydroxy compound, or a diol having a cyclic ether structure may be used as the dihydroxy compound serving as a constituent unit of polycarbonate, in combination with the dihydroxy compound (A), such as the dihydroxy compound represented by the general formula (2).

Although the alicyclic dihydroxy compound that may be used in the polycarbonate resin is not particularly limited, a alicyclic dihydroxy compound containing a five-membered ring structure or a six-membered ring structure is preferably used. The six-membered ring structure may be fixed in a chair shape or a boat shape by a covalent bond. When the alicyclic dihydroxy compound has the five-membered ring structure or the six-membered ring structure, the heat resistance of the polycarbonate resin to be obtained can be improved. The number of carbon atoms in the alicyclic dihydroxy compound is preferably 70 or less, more preferably 50 or less, still more preferably 30 or less. As the number of carbon atoms in the alicyclic dihydroxy compound increases, the heat resistance is improved. However, there are risks in that: it becomes difficult to synthesize the compound; it becomes difficult to purify the compound; or cost for the compound increases. As the number of carbon atoms in the alicyclic dihydroxy compound reduces, it becomes easy to purify the compound and the compound becomes more easily available.

Specific examples of the alicyclic dihydroxy compound containing a five-membered ring structure or a six-membered ring structure include alicyclic dihydroxy compounds each represented by the general formula (I) or (II):

$$HOCH_2-R^{10}-CH_2OH \quad (I)$$

$$HO-R^{11}-OH \quad (II)$$

in the general formula (I) and the general formula (II), $R^{10}$ and $R^{11}$ each represent a cycloalkylene group having 4 to 20 carbon atoms.

Cyclohexanedimethanol serving as the alicyclic dihydroxy compound represented by the general formula (I) encompasses various isomers in each of which $R^{10}$ in the general formula (I) is represented by the general formula (Ia), where $R^9$ represents a hydrogen atom or a substituted or unsubstituted alkyl group having 1 to 12 carbon atoms. Specific examples thereof include 1,2-cyclohexanedimethanol, 1,3-cyclohexanedimethanol, and 1,4-cyclohexanedimethanol.

Tricyclodecanedimethanol or pentacyclopentadecanedimethanol serving as the alicyclic dihydroxy compound represented by the general formula (I) encompasses various isomers in each of which $R^{10}$ in the general formula (I) is represented by the general formula (Ib), where n represents 0 or 1.

(Ib)

Decalindimethanol or tricyclotetradecanedimethanol serving as the alicyclic dihydroxy compound represented by the general formula (I) encompasses various isomers in each of which $R^{10}$ in the general formula (I) is represented by the general formula (Ic), where m represents 0 or 1. Specific examples thereof include 2,6-decalindimethanol, 1,5-decalindimethanol, and 2,3-decalindimethanol.

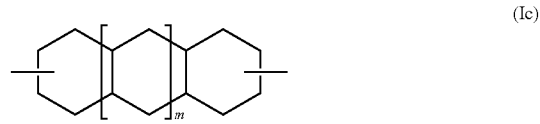

(Ic)

Norbornanedimethanol serving as the alicyclic dihydroxy compound represented by the general formula (I) encompasses various isomers in each of which $R^{10}$ in the general formula (I) is represented by the general formula (Id). Specific examples thereof include 2,3-norbornanedimethanol and 2,5-norbornanedimethanol.

(Id)

Adamantanedimethanol serving as the alicyclic dihydroxy compound represented by the general formula (I) encompasses various isomers in each of which $R^{10}$ in the general formula (I) is represented by the general formula (Ie). A specific example thereof is 1,3-adamantanedimethanol.

(Ie)

Cyclohexanediol serving as the alicyclic dihydroxy compound represented by the general formula (II) encompasses various isomers in each of which $R^{11}$ in the general formula (II) is represented by the general formula (Ia), where $R^9$ represents a hydrogen atom or a substituted or unsubstituted alkyl group having 1 to 12 carbon atoms. Specific examples thereof include 1,2-cyclohexanediol, 1,3-cyclohexanediol, 1,4-cyclohexanediol, and 2-methyl-1,4-cyclohexanediol.

Tricyclodecanediol or pentacyclopentadecanediol serving as the alicyclic dihydroxy compound represented by the general formula (II) encompasses various isomers in each of which $R^{11}$ in the general formula (II) is represented by the general formula (Ib), where n represents 0 or 1.

Decalindiol or tricyclotetradecanediol serving as the alicyclic dihydroxy compound represented by the general formula (II) encompasses various isomers in each of which $R^{11}$ in the general formula (II) is represented by the general formula (Ic), where m represents 0 or 1. As the decalindiol or the tricyclotetradecanediol, there may be specifically used, for example, 2,6-decalindiol, 1,5-decalindiol, or 2,3-decalindiol.

Norbornanediol serving as the alicyclic dihydroxy compound represented by the general formula (II) encompasses various isomers in each of which $R^{11}$ in the general formula (II) is represented by the general formula (Id). As the norbornanediol, there may be specifically used, for example, 2,3-norbornanediol or 2,5-norbornanediol.

Adamantanediol serving as the alicyclic dihydroxy compound represented by the general formula (II) encompasses various isomers in each of which $R^{11}$ in the general formula (II) is represented by the general formula (Ie). As the adamantanediol, there may be specifically used, for example, 1,3-adamantanediol.

Of the specific examples of the alicyclic dihydroxy compound, in particular, cyclohexanedimethanols, tricyclodecanedimethanols, adamantanediols, and pentacyclopentadecanedimethanols are preferred, and 1,4-cyclohexanedimethanol, 1,3-cyclohexanedimethanol, 1,2-cyclohexanedimethanol, and tricyclodecanedimethanol are more preferred from the viewpoints of the ease of availability and the ease of handling.

Examples of the aliphatic dihydroxy compound that may be used include ethylene glycol, 1,3-propanediol, 1,2-propanediol, 1,4-butanediol, 1,3-butanediol, 1,2-butanediol, 1,5-heptanediol, and 1,6-hexanediol.

Examples of the oxyalkylene glycols that may be used include diethylene glycol, triethylene glycol, tetraethylene glycol, and polyethylene glycol.

Examples of the aromatic dihydroxy compound that may be used include 2,2-bis(4-hydroxyphenyl)propane[=bisphenol A], 2,2-bis(4-hydroxy-3,5-dimethylphenyl)propane, 2,2-bis(4-hydroxy-3,5-diethylphenyl)propane, 2,2-bis(4-hydroxy-(3,5-diphenyl)phenyl)propane, 2,2-bis(4-hydroxy-3, 5-dibromophenyl)propane, 2,2-bis(4-hydroxyphenyl) pentane, 2,4'-dihydroxy-diphenylmethane, bis(4-hydroxyphenyl)methane, bis(4-hydroxy-5-nitrophenyl) methane, 1,1-bis(4-hydroxyphenyl)ethane, 3,3-bis(4-hydroxyphenyl)pentane, 1,1-bis(4-hydroxyphenyl) cyclohexane, bis(4-hydroxyphenyl) sulfone, 2,4'-dihydroxydiphenyl sulfone, bis(4-hydroxyphenyl) sulfide, 4,4'-dihydroxydiphenyl ether, 4,4'-dihydroxy-3,3'-dichlorodiphenyl ether, 4,4'-dihydroxy-2,5-diethoxydiphenyl ether, 9,9-bis[4-(2-hydroxyethoxy)phenyl]fluorene, 9,9-bis [4-(2-hydroxyethoxy-2-methyl)phenyl]fluorene, 9,9-bis(4-hydroxyphenyl)fluorene, and 9,9-bis(4-hydroxy-2-methylphenyl)fluorene.

Examples of the diol having a cyclic ether structure that may be used include spiroglycols and dioxane glycols.

The exemplified compounds are examples of the alicyclic dihydroxy compound, the aliphatic dihydroxy compound, the oxyalkylene glycol, the aromatic dihydroxy compound, and the diol having a cyclic ether structure that may be used in the present invention, and the dihydroxy compound (B) is by no means limited thereto. One or more kinds of those compounds may be used together with the dihydroxy compound represented by the general formula (2).

The use of any such dihydroxy compound (B) can provide effects, such as an improvement in flexibility, an improvement in heat resistance, and an improvement in formability, in accordance with applications. The ratio of the dihydroxy compound (A), such as the dihydroxy compound represented by the general formula (2), to all the dihydroxy compounds constituting the polycarbonate resin is not particularly limited, but is preferably 10 mol % or more, more preferably 40 mol % or more, still more preferably 60 mol % or more, and is preferably 90 mol % or less, more preferably 80 mol % or less, still more preferably 70 mol % or less. When the content of a constituent unit derived from any other dihydroxy compound is excessively large, there is a risk in that the performance of the resin, such as optical characteristics, reduces.

When the alicyclic dihydroxy compound out of the other dihydroxy compounds is used, the ratio of the total of the dihydroxy compound (A), such as the dihydroxy compound represented by the general formula (2), and the alicyclic dihydroxy compound to all the dihydroxy compounds constituting the polycarbonate resin is not particularly limited, but is preferably 80 mol % or more, more preferably 90 mol % or more, still more preferably 95 mol % or more.

In addition, although a content ratio between a constituent unit derived from the dihydroxy compound (A), such as the dihydroxy compound represented by the general formula (2), and a constituent unit derived from the alicyclic dihydroxy compound in the polycarbonate resin may be selected from any appropriate ratios, a ratio "constituent unit derived from the dihydroxy compound represented by the general formula (2):constituent unit derived from the alicyclic dihydroxy compound" is preferably from 1:99 to 99:1 (mol %), and the ratio "constituent unit derived from the dihydroxy compound represented by the general formula (2):constituent unit derived from the alicyclic dihydroxy compound" is more preferably from 10:90 to 90:10 (mol %). When the content of the constituent unit derived from the dihydroxy compound represented by the general formula (2) exceeds the range and the content of the constituent unit derived from the alicyclic dihydroxy compound falls below the range, there is a risk in that the coloring of the resin becomes liable to occur. In contrast, when the content of the constituent unit derived from the dihydroxy compound represented by the general formula (2) falls below the range and the content of the constituent unit derived from the alicyclic dihydroxy compound exceeds the range, there is a risk in that the molecular weight of the resin hardly increases.

When the aliphatic dihydroxy compound, the oxyalkylene glycol, the aromatic dihydroxy compound, and the diol having a cyclic ether structure are used, the ratio of the total of the dihydroxy compound (A), such as the dihydroxy compound represented by the general formula (2), and the respective dihydroxy compounds to all the dihydroxy compounds constituting the polycarbonate resin is not particularly limited, and may be selected from any appropriate ratios. In addition, a content ratio between the constituent unit derived from the dihydroxy compound (A), such as the dihydroxy compound represented by the general formula (2), and a constituent unit derived from each of those dihydroxy compounds is also not particularly limited, and may be selected from any appropriate ratios.

The polymerization degree of the polycarbonate resin having the constituent units derived from the dihydroxy compounds (which is hereinafter sometimes referred to as "polycarbonate copolymer") is preferably 0.40 dl/g or more, more preferably 0.43 dl/g or more, and is preferably 2.00 dl/g or less, more preferably 1.60 dl/g or less, in terms of a reduced viscosity measured as follows: a solution is precisely prepared by using a mixed solution containing phenol and 1,1,2,2-tetrachloroethane at a mass ratio of 1:1 as a solvent so as to have a polycarbonate concentration of 1.00 g/dl, and its reduced viscosity is measured at a temperature of 30.0° C.±0.1° C. (the reduced viscosity is hereinafter simply referred to as "reduced viscosity of the polycarbonate"). When the reduced viscosity of the polycarbonate is excessively low, there is a risk in that the mechanical strength of a molded article obtained by molding the polycarbonate copolymer becomes weak. When the reduced viscosity of the polycarbonate is excessively high, there is a risk in that the fluidity of the polycarbonate copolymer at the time of the molding reduces to reduce its cycle characteristic and to lengthen its molding cycle, and there is also a risk in that the birefringence of the molded article to be obtained increases.

The Abbe number of the polycarbonate resin is preferably 20 or more, more preferably 50 or more, still more preferably 55 or more. As the Abbe number of the polycarbonate resin increases, the wavelength dispersion of a refractive index of the resin reduces and hence a chromatic aberration reduces. Accordingly, the resin becomes suitable as an optical film. As the Abbe number of the polycarbonate resin reduces, the wavelength dispersion of the refractive index increases and hence the chromatic aberration increases. Therefore, the Abbe number of the polycarbonate resin is preferably as large as possible, and an upper limit therefor is not particularly limited.

The 5% thermal weight loss temperature of the polycarbonate resin is preferably 340° C. or more, more preferably 345° C. or more. As the 5% thermal weight loss temperature increases, the resin is improved in thermal stability and hence can be used at higher temperature. In addition, as the 5% thermal weight loss temperature increases, the temperature at which the retardation layer is produced can be increased and hence a temperature control range at the time of the production can be widened. Accordingly, the production is facilitated. As the 5% thermal weight loss temperature reduces, there is a risk in that the thermal stability may reduce to make it difficult to use the resin at high temperature. In addition, as the 5% thermal weight loss temperature reduces, there is a risk in that an allowable range for the control at the time of the production narrows to make it difficult to produce the retardation layer. Therefore, an upper limit for the 5% thermal weight loss temperature is not particularly limited, and the temperature is desirably as high as possible. The decomposition temperature of the copolymer serves as the upper limit.

The Izod impact strength of the polycarbonate resin is preferably 30 J/m$^2$ or more. An upper limit for the Izod impact strength is not particularly limited because as the Izod impact strength increases, a molded body obtained by molding the resin is increased in strength and hence becomes less liable to break.

In the polycarbonate resin, the amount of a produced gas except a phenol component at 110° C. per unit area (hereinafter sometimes simply referred to as "amount of a produced gas") is preferably 5 ng/cm$^2$ or less, and the amount of a produced gas derived from a dihydroxy compound except the dihydroxy compound represented by the general formula (2) is more preferably 0.5 ng/cm$^2$ or less.

When the polycarbonate resin is subjected to differential scanning calorimetry (DSC), the resin provides a single glass transition temperature. However, when the kinds of the dihydroxy compound represented by the general formula (2) and the alicyclic dihydroxy compound, and a compounding ratio therebetween are adjusted, the glass transition temperature can be adjusted, i.e., the resin can be obtained as a polymer having any appropriate glass transition temperature ranging from, for example, about 45° C. to about 155° C. in accordance with applications.

In a film application, flexibility is generally required. Accordingly, the glass transition temperature of the polycarbonate resin is adjusted to preferably 45° C. or more, more preferably from 45° C. to 130° C.

The polycarbonate resin preferably has at least two of the physical properties at the same time, and more preferably further has any other physical property together therewith.

The polycarbonate resin may be produced by a melt polymerization method involving causing the dihydroxy compounds including the dihydroxy compound (A) to react with the carbonic acid diester in the presence of the polymerization catalyst.

<Carbonic Acid Diester>

Specific examples of the carbonic acid diester to be used in the method of producing the polycarbonate resin include diphenyl carbonate, substituted diphenyl carbonates typified by ditolyl carbonate, dimethyl carbonate, diethyl carbonate, and di-t-butyl carbonate. Of those, diphenyl carbonate and substituted diphenyl carbonates are preferred. Those carbonic acid diesters may be used alone or in combination thereof.

The carbonic acid diester is preferably used at a molar ratio of from 0.90 to 1.10 with respect to all the dihydroxy compounds to be used in the reaction, and is more preferably used at a molar ratio of from 0.96 to 1.04. When the molar ratio becomes less than 0.90, the amount of a terminal OH group of the produced polycarbonate resin increases, and hence there is a risk in that the thermal stability of the polymer deteriorates or a desired polymer is not obtained. When the molar ratio becomes more than 1.10, under the same conditions, there is a risk in that the rate of an ester exchange reaction reduces and hence it becomes difficult to produce a polycarbonate resin having a desired molecular weight. In addition, there is a risk in that the amount of the carbonic acid diester remaining in the produced polycarbonate copolymer increases, and the remaining carbonic acid diester becomes responsible for an odor at the time of the molding of the copolymer or in a molded article thus obtained.

The retardation layer is obtained by, for example, stretching a film formed from the polycarbonate resin. Any appropriate forming processing method may be adopted as a method of forming a film from the polycarbonate resin. Specific examples thereof include a compression molding method, a transfer molding method, an injection molding method, an extrusion molding method, a blow molding method, a powder forming method, an FRP molding method, a cast coating method (e.g., a casting method), a calender molding method, and a hot-press method. Of those, an extrusion molding method or a cast coating method is preferred. This is because the extrusion molding method or the cast coating method can increase the smoothness of the film to be obtained and provide satisfactory optical uniformity. Forming conditions may be appropriately set depending on, for example, the composition and kind of the resin to be used and desired characteristics of the retardation layer. Many film products are commercially available as the polycarbonate resin, and hence each of the commercially available films may be subjected as it is to stretching treatment.

The stretching ratio of the film may vary depending on, for example, a desired in-plane retardation value and a desired thickness of the retardation layer, the kind of the resin to be used, the thickness of the film to be used, and a stretching temperature. Specifically, the stretching ratio is preferably from 1.75 times to 3.00 times, more preferably from 1.80 times to 2.80 times, still more preferably from 1.85 times to 2.60 times. When the film is stretched at such ratio, a retardation layer having an in-plane retardation with which the effects of the present invention can be appropriately exhibited can be obtained.

The stretching temperature of the film may vary depending on, for example, the desired in-plane retardation value and the desired thickness of the retardation layer, the kind of the resin to be used, the thickness of the film to be used, and the stretching ratio. Specifically, the stretching temperature is preferably from 125° C. to 150° C., more preferably from 130° C. to 140° C., still more preferably from 130° C. to 135° C. When the film is stretched at such temperature, a retardation layer having an in-plane retardation with which the effects of the present invention can be appropriately exhibited can be obtained.

Any appropriate stretching method may be adopted as a method of stretching the film. Specifically, various stretching methods, such as free-end stretching, fixed-end stretching, free-end shrinkage, and fixed-end shrinkage, may be used alone, or may be used simultaneously or sequentially. With regard to a stretching direction, the stretching may be performed in various directions or dimensions, such as a horizontal direction, a vertical direction, a thickness direction, and a diagonal direction.

In one embodiment, the retardation layer is formed by subjecting a resin film to free-end uniaxial stretching or fixed-end uniaxial stretching. A specific example of the free-end uniaxial stretching is a method involving stretching the resin film between rolls having different peripheral speeds while running the resin film in its lengthwise direction. A specific example of the fixed-end uniaxial stretching is a method involving stretching the resin film in its widthwise direction (lateral direction) while running the resin film in its lengthwise direction.

In one embodiment, the retardation layer is produced by obliquely stretching an elongate resin film in a direction at the angle α relative to its lengthwise direction in a continuous manner. When the oblique stretching is adopted, an elongate stretched film having an alignment angle that is the angle α relative to the lengthwise direction of the film (i.e., having a slow axis in a direction at the angle c) is obtained. As a result, for example, a roll-to-roll process can be performed at the time of its lamination with the polarizer, and hence a production process can be simplified. The term "roll-to-roll process" refers to a system involving laminating films with their longitudinal directions aligned with each other while conveying the films with rolls.

As a stretching machine to be used for the oblique stretching, there is given, for example, a tenter stretching machine capable of applying feeding forces, or tensile forces or take-up forces, having different speeds on left and right sides in a lateral direction and/or a longitudinal direction. Examples of the tenter stretching machine include a lateral uniaxial stretching machine and a simultaneous biaxial stretching machine, and any appropriate stretching machine may be used as long as the elongate resin film can be continuously subjected to the oblique stretching.

A-5. λ/2 Plate

The circularly polarizing plate for an organic EL display apparatus of the present invention may include a λ/2 plate between the polarizer 10 and the retardation layer 20.

When an angle formed between an absorption axis A of the polarizer 10 and a slow axis B of the λ/2 plate is represented by α (°), and an angle formed between the slow axis B of the λ/2 plate and a slow axis C of the retardation layer 20 is represented by β (°), the angles α and β preferably satisfy the expression (1a) or the expression (1b).

$$\alpha+35°<\beta<\alpha+55° \ (0°\leq\alpha\leq90°) \tag{1a}$$

$$\alpha-35°<\beta<\alpha-55° \ (90°<\alpha<180°) \tag{1b}$$

In the expression (1a), the angle α and the angle β have a relationship of preferably α+38°<β<α+52°, more preferably α+40°<β<α+50°, still more preferably α+42°<β<α+48°, particularly preferably α+44°<β<α+46°. In the expression (1b), the angle α and the angle β have a relationship of preferably α−38°<β<α−52°, more preferably α−40°<β<α−50°, still more preferably α−42°<β<α−48°, particularly preferably α−44°<β<α−46°. When the angles α and β satisfy the expression (1a) or the expression (1b), a characteristic close to an ideal reverse wavelength dispersion characteristic can be provided by the λ/2 plate and the retardation layer 20 (λ/4 plate). More specifically, when the relationship between the angle α and the angle β is optimized for each case depending on the value for the angle α, a polarization state can be transformed under a nearly ideal state for each of RGB wavelengths. As a result, an extremely excellent antireflection characteristic can be achieved.

The angle α preferably satisfies the expression (2).

$$5°\leq\alpha\leq85° \text{ or } 95°\leq\alpha\leq175° \tag{2}$$

The angle α satisfies preferably 25°≤α≤65° or 115°≤α≤155°, more preferably 35°≤α≤55° or 125°≤α≤145°, still more preferably 40°≤α≤550° or 130°≤α≤140°. When the angle α satisfies the expression (2), the λ/2 plate and the retardation layer 20 (λ/4 plate) can be formed of materials having the same wavelength dispersion characteristic (e.g., the same resin). As a result, the retardation value of each retardation layer can be easily controlled, and ultimately, a circularly polarizing plate having an extremely excellent reflection hue in each of a front direction and an oblique direction can be obtained. When the λ/2 plate and the retardation layer 20 (λ/4 plate) are formed of materials having wavelength dispersion characteristics different from each other, the angle α may be set to any appropriate value.

When the λ/2 plate is present between the polarizer 10 and the retardation layer 20, with regard to the wavelength dispersion characteristic of the retardation layer 20 configured to function as a λ/4 plate (in particular, a wavelength range in which its retardation deviates from λ/4), the retardation can be appropriately regulated. The in-plane retardation Re(550) of such λ/2 plate is preferably from 220 nm to 320 nm, more preferably from 240 nm to 300 nm, still more preferably from 250 nm to 280 nm. The λ/2 plate typically has a refractive index ellipsoid of nx>ny=nz or nx>ny>nz. The Nz coefficient of the λ/2 plate is, for example, from 0.9 to 1.3.

The thickness of the λ/2 plate may be set so that the λ/2 plate can most appropriately function as a λ/2 plate. In other words, the thickness may be set so that a desired in-plane retardation may be obtained. Specifically, the thickness is preferably from 1 μm to 80 μm, more preferably from 10 μm to 60 μm, still more preferably from 30 μm to 50 μm.

The λ/2 plate contains a resin having an absolute value of its photoelastic coefficient of preferably $2\times10^{-11}$ m²/N or less, more preferably from $2.0\times10^{-3}$ m²/N to $1.5\times10^{-11}$ m²/N, still more preferably from $1.0\times10^{-12}$ m²/N to $1.2\times10^{-11}$ m²/N. When the absolute value of the photoelastic coefficient falls within such range, a retardation change hardly occurs in the case where a shrinkage stress is generated at the time of heating. Therefore, when the λ/2 plate is formed using the resin having such absolute value of its photoelastic coefficient, heat unevenness in an organic EL display apparatus to be obtained can be satisfactorily prevented.

The λ/2 plate may show such a reverse wavelength dispersion characteristic that its retardation value increases in accordance with an increase in wavelength of measurement light, may show such a positive wavelength dispersion characteristic that the retardation value reduces in accordance with an increase in wavelength of the measurement light, or may show such a flat wavelength dispersion characteristic that the retardation value remains substantially unchanged even when the wavelength of the measurement light is changed. The λ/2 plate preferably has a ratio Re(450)/Re(550) of from 0.99 to 1.03, and preferably has a ratio Re(650)/Re(550) of from 0.98 to 1.02.

The λ/2 plate may include any appropriate resin film that can satisfy such optical characteristics and mechanical characteristics as described above. Typical examples of such resin include a cyclic olefin-based resin and a cellulose-based resin. Of those, a cyclic olefin-based resin is preferred because a more desired wavelength dispersion characteristic is shown. The cyclic olefin-based resin is a generic term for resins each polymerized by using a cyclic olefin as a polymerization unit, and examples thereof include resins described in JP 01-240517 A, JP 03-14882 A, and JP 03-122137 A. Specific examples thereof include: a ring-opened (co)polymer of the cyclic olefin, an addition polymer of the cyclic olefin, a copolymer (typically a random copolymer) of the cyclic olefin and an α-olefin, such as ethylene or propylene, and graft-modified products obtained by modifying the polymers with unsaturated carboxylic acids or derivatives thereof; and hydrogenated products thereof. Specific examples of the cyclic olefin include norbornene-based monomers.

Examples of the norbornene-based monomers include: norbornene, alkyl and/or alkylidene substituted products thereof, such as 5-methyl-2-norbornene, 5-dimethyl-2-norbornene, 5-ethyl-2-norbornene, 5-butyl-2-norbornene, and 5-ethylidene-2-norbornene, and polar group (e.g., halogen) substituted products thereof; dicyclopentadiene and 2,3-dihydrodicyclopentadiene; dimethanooctahydronaphthalene, alkyl and/or alkylidene substituted products thereof, and polar group (e.g., halogen) substituted products thereof, such as 6-methyl-1,4:5,8-dimethano-1,4,4a,5,6,7,8,8a-octahydronaphthalene, 6-ethyl-1,4:5,8-dimethano-1,4,4a,5,6,7,8,8a-octahydronaphthalene, 6-ethylidene-1,4:5,8-dimethano-1,4,4a,5,6,7,8,8a-octahydronaphthalene, 6-chloro-1,4:5,8-dimethano-1,4,4a,5,6,7,8,8a-octahydronaphthalene, 6-cyano-1,4:5,8-dimethano-1,4,4a,5,6,7,8,8a-octahydronaphthalene, 6-pyridyl-1,4:5,8-dimethano-1,4,4a,5,6,7,8,8a-octahydronaphthalene, and 6-methoxycarbonyl-1,4:5,8-dimethano-1,4a,5,6,7,8,8a-octahydronaphthalene; and trimers or tetramers of cyclopentadiene, such as 4,9:5,8-dimethano-3a,4,4a,5,8,8a,9,9a-octahydro-1H-benzoindene and 4,11:5,10:6,9-trimethano-3a,4,4a,5,5a,6,9,9a,10,10a,11,11a-dodecahydro-1H-cyclopentaanthracene.

In the λ/2 plate, any other cycloolefin that may be subjected to ring-opening polymerization may be used in combination with the cycloolefin to the extent that the object of the present invention is not impaired. Specific examples of such cycloolefin include compounds each having one reactive double bond, such as cyclopentene, cyclooctene, and 5,6-dihydrodicyclopentadiene.

The number-average molecular weight (Mn) of the cyclic olefin-based resin measured by a gel permeation chromatograph (GPC) method based on a toluene solvent is preferably from 25,000 to 200,000, more preferably from 30,000 to 100,000, most preferably from 40,000 to 80,000. When the number-average molecular weight falls within the range, a film that is excellent in mechanical strength and has satisfactory solubility, satisfactory formability, and satisfactory casting operability can be obtained.

When the cyclic olefin-based resin is obtained by hydrogenating a ring-opened polymer of a norbornene-based monomer, a hydrogenation rate is preferably 90% or more, still more preferably 95% or more, most preferably 99% or more. When the hydrogenation rate falls within such range, the resin is excellent in, for example, heat deterioration resistance and light deterioration resistance.

Various products are commercially available as the cyclic olefin-based resin. Specific examples thereof include: products available under the product names "ZEONEX" and "ZEONOR" from Zeon Corporation; a product available under the product name "Arton" from JSR Corporation; a product available under the product name "TOPAS" from TICONA; and a product available under the product name "APEL" from Mitsui Chemicals, Inc.

Any appropriate cellulose-based resin (typically an ester of cellulose and an acid) may be adopted as the cellulose-based resin. The cellulose-based resin is preferably an ester of cellulose and a fatty acid. Specific examples of such cellulose-based resin include cellulose triacetate (triacetylcellulose: TAC), cellulose diacetate, cellulose tripropionate, and cellulose dipropionate. Of those, cellulose triacetate (triacetylcellulose: TAC) is particularly preferred. This is because TAC has low birefringence and high transmittance. TAC, for which many products are commercially available, is also advantageous in terms of the ease of availability and cost.

Specific examples of the commercially available products of TAC include: products available under the product names "UV-50", "UV-80", "SH-50", "SH-80", "TD-80U", "TD-TAC", and "UZ-TAC" from Fujifilm Corporation; products available under the product name "KC series" from Konica Corporation; and products available under the product name "cellulose triacetate 80 μm series" from Lonza Japan Ltd.

The λ/2 plate is obtained by, for example, stretching a film formed from the cyclic olefin-based resin or the cellulose-based resin. Any appropriate forming processing method may be adopted as a method of forming a film from the cyclic olefin-based resin or the cellulose-based resin. Specific examples thereof include a compression molding method, a transfer molding method, an injection molding method, an extrusion molding method, a blow molding method, a powder forming method, an FRP molding method, a cast coating method (e.g., a casting method), a calender molding method, and a hot-press method. Of those, an extrusion molding method or a cast coating method is preferred. This is because the extrusion molding method or the cast coating method can increase the smoothness of the film to be obtained and provide satisfactory optical uniformity. Forming conditions may be appropriately set depending on, for example, the composition and kind of the resin to be used and desired characteristics of the λ/2 plate. Many film products are commercially available as the cyclic olefin-based resin or the cellulose-based resin, and hence each of the commercially available films may be subjected as it is to stretching treatment.

The stretching ratio of the film may vary depending on, for example, a desired in-plane retardation value and a desired thickness of the λ/2 plate, the kind of the resin to be used, the thickness of the film to be used, and a stretching temperature. Specifically, the stretching ratio is preferably from 1.75 times to 3.00 times, more preferably from 1.80 times to 2.80 times, still more preferably from 1.85 times to 2.60 times. When the film is stretched at such ratio, a λ/2 plate having an in-plane retardation with which the effects of the present invention can be appropriately exhibited can be obtained.

The stretching temperature of the film may vary depending on, for example, the desired in-plane retardation value and the desired thickness of the λ/2 plate, the kind of the resin to be used, the thickness of the film to be used, and the stretching ratio. Specifically, the stretching temperature is preferably from 125° C. to 150° C., more preferably from 130° C. to 140° C., still more preferably from 130° C. to 135° C. When the film is stretched at such temperature, a λ/2 plate having an in-plane retardation with which the effects of the present invention can be appropriately exhibited can be obtained.

Any appropriate stretching method may be adopted as a method of stretching the film. Specifically, various stretching methods, such as free-end stretching, fixed-end stretching, free-end shrinkage, and fixed-end shrinkage, may be used alone, or may be used simultaneously or sequentially. With regard to a stretching direction, the stretching may be performed in various directions or dimensions, such as a horizontal direction, a vertical direction, a thickness direction, and a diagonal direction.

In one embodiment, the λ/2 plate is formed by subjecting the resin film to free-end uniaxial stretching or fixed-end uniaxial stretching. The free-end uniaxial stretching is specifically, for example, a method involving stretching the resin film between rolls having different peripheral speeds while running the film in its lengthwise direction. The fixed-end uniaxial stretching is specifically, for example, a method involving stretching the resin film in its widthwise direction (lateral direction) while running the film in its longitudinal direction.

In another embodiment, the λ/2 plate is produced by obliquely stretching the elongate resin film in a direction at an angle α relative to its longitudinal direction in a continuous manner. When the oblique stretching is adopted, an elongate stretched film having an alignment angle α relative to the longitudinal direction of the film (i.e., having a slow axis in a direction at an angle α) is obtained. As a result, for example, a roll-to-roll process can be performed at the time of its lamination with the polarizer, and hence a production process can be simplified.

As a stretching machine to be used for the oblique stretching, for example, there is given a tenter stretching machine capable of applying feeding forces, or tensile forces or take-up forces, having different speeds on left and right sides in a lateral direction and/or a longitudinal direction. Examples of the tenter stretching machine include a lateral uniaxial stretching machine and a simultaneous biaxial stretching machine, and any appropriate stretching machine may be used as long as the elongate resin film can be continuously subjected to the oblique stretching.

A-6. Conductive Layer and Isotropic Substrate with Conductive Layer

The circularly polarizing plate 100 for an organic EL display apparatus may include a conductive layer or an isotropic substrate with a conductive layer between the barrier layer 30 and the pressure-sensitive adhesive layer 40. In addition, the circularly polarizing plate 100 for an organic EL display apparatus may include a conductive layer or an isotropic substrate with a conductive layer between the retardation layer 20 and the barrier layer 30.

The conductive layer may be formed by forming a metal oxide film on any appropriate substrate by any appropriate film formation method (e.g., a vacuum deposition method, a sputtering method, a CVD method, an ion plating method, or a spraying method). The conductive layer containing a metal oxide may be patterned by an etching method or the like.

Examples of the metal oxide include indium oxide, tin oxide, zinc oxide, an indium-tin composite oxide, a tin-antimony composite oxide, a zinc-aluminum composite oxide, and an indium-zinc composite oxide. Of those, an indium-tin composite oxide (ITO) is preferred.

When the conductive layer contains a metal oxide, the thickness of the conductive layer is preferably 50 nm or less, more preferably 35 nm or less. A lower limit for the thickness of the conductive layer is preferably 10 nm. When the thickness of the conductive layer falls within such range, a circularly polarizing plate for an organic EL display apparatus capable of more effectively expressing the effects of the present invention can be provided.

The isotropic substrate with a conductive layer has a conductive layer on at least one surface of an isotropic substrate. The isotropic substrate with a conductive layer preferably has a conductive layer on one surface of the isotropic substrate. The isotropic substrate with a conductive layer may be formed by, for example, forming a metal oxide film on the isotropic substrate by any appropriate film formation method (e.g., a vacuum deposition method, a sputtering method, a CVD method, an ion plating method, or a spraying method).

Any appropriate isotropic substrate may be adopted as the isotropic substrate. The term "isotropic" as used herein refers to having an in-plane retardation Re(550) of from 0 nm to 10 nm and a thickness direction retardation Rth(550) of from −10 nm to +10 nm. Examples of such isotropic substrate include: a material containing, as a main skeleton, a resin having no conjugated system, such as a norbornene-based resin or an olefin-based resin; and a material having a cyclic structure, such as a lactone ring or a glutarimide ring, in a main chain of an acrylic resin. The use of such material can suppress and reduce the expression of a retardation caused by the alignment of molecular chains when the isotropic substrate is formed.

The thickness of the isotropic substrate is preferably 50 μm or less, more preferably 35 nm or less. A lower limit for the thickness of the conductive layer is preferably 10 nm. When the thickness of the conductive layer falls within such range, a circularly polarizing plate for an organic EL display apparatus capable of more effectively expressing the effects of the present invention can be provided.

The conductive layer or the conductive layer of the isotropic substrate with a conductive layer may be patterned by an etching method, printing, or the like. Through the patterning, a conductive part and an insulating part may be formed. Any appropriate method may be adopted as a patterning method for such patterning to the extent that the effects of the present invention are not impaired. Examples of such patterning method include a wet etching method and a screen printing method.

Any appropriate method may be adopted as the wet etching method. As a specific operation for the wet etching method, there is given, for example, an operation described in US 2011/0253668 A, which is incorporated herein by reference.

A mask to be used in the wet etching method may be formed in any appropriate shape in accordance with a desired conductive pattern. After etching treatment, a region in which the mask is formed becomes the conductive part, and a region in which the mask is not formed becomes the insulating part. The mask is formed of, for example, a photosensitive resin. As a method of forming the mask, there is given, for example, a screen printing method.

After the formation of the mask, for example, the isotropic substrate with a conductive layer is subjected to etching treatment by being immersed in an etchant. Specific examples of the etchant include nitric acid, phosphoric acid, acetic acid, hydrochloric acid, and mixed liquids thereof. After the etching treatment, the mask is removed by a conventional method.

In the screen printing method, for example, the conductive part is formed by selectively applying a material for forming the conductive part in accordance with a desired conductive pattern. Meanwhile, the insulating part is formed by applying a material for forming the insulating part to a region other than a region in which the conductive part is to be formed. The material for forming the insulating part preferably contains a non-conductive light-scattering body. In this embodiment, the conductive part and the insulating part may include resin matrices formed of the same resin, or may include resin matrices formed of resins different from each other.

A-7. Pressure-Sensitive Adhesive Layer

As described above, the pressure-sensitive adhesive layer 40 has the barrier function. In the case where the barrier function is imparted to the pressure-sensitive adhesive layer of the circularly polarizing plate for an organic EL display apparatus of the present invention, a circularly polarizing plate having an excellent organic EL panel-protecting function can be obtained by a synergistic effect with the barrier layer. Further, an organic EL display apparatus can be produced with production efficiency more excellent than that in the case where the barrier layer is formed on an organic EL panel. A pressure-sensitive adhesive having the barrier function is, for example, a rubber-based pressure-sensitive adhesive composition using a rubber-based polymer as a base polymer.

Examples of the rubber-based polymer include: a conjugated diene-based polymer obtained by polymerizing one kind of conjugated diene compound, a conjugated diene-based copolymer obtained by polymerizing two or more kinds of conjugated diene compounds, and a conjugated diene-based copolymer obtained by copolymerizing a conjugated diene compound and an aromatic vinyl compound; and hydrogenated products thereof.

The conjugated diene compound is not particularly limited as long as the compound is a monomer having a polymerizable conjugated diene. Specific examples of the conjugated diene compound include 1,3-butadiene, isoprene, 2,3-dimethyl-1,3-butadiene, 1,3-pentadiene, 3-methyl-1,3-pentadiene, 1,3-heptadiene, and 1,3-hexadiene. Of those, 1,3-butadiene and isoprene are preferred from the viewpoint of the ease of industrial availability. The conjugated diene compounds may be used alone or in combination thereof.

The aromatic vinyl compound is not particularly limited as long as the compound is a monomer having an aromatic vinyl structure copolymerizable with the conjugated diene compound. Specific examples of the aromatic vinyl compound include styrene, p-methylstyrene, α-methylstyrene, vinylethylbenzene, vinylxylene, vinylnaphthalene, and diphenylethylene. Of those, styrene is preferred from the viewpoint of the ease of industrial availability. The aromatic vinyl compounds may be used alone or in combination thereof.

The diene-based copolymers may be random copolymers or may be block copolymers. In addition, a diene-based copolymer may be obtained by copolymerizing a compound except the conjugated diene compound and the aromatic vinyl compound.

The conjugated diene-based copolymer obtained by copolymerizing the conjugated diene compound and the aromatic vinyl compound preferably has a molar ratio "conjugated diene compound/aromatic vinyl compound" of the conjugated diene compound to the aromatic vinyl compound of from 10/90 to 90/10 (mol %).

Specific examples of such conjugated diene-based (co)polymer include a butadiene rubber (BR), an isoprene rubber (IR), a styrene-butadiene copolymer (SBR), a butadiene-isoprene-styrene random copolymer, an isoprene-styrene random copolymer, a styrene-isoprene block copolymer (SIS), a butadiene-styrene copolymer, a styrene-ethylene-butadiene block copolymer (SEBS), and an acrylonitrile-butadiene rubber (NBR). The (co)polymers may be used alone or in combination thereof. Of those, an isoprene-styrene copolymer is preferred. In addition, hydrogenated products thereof may be suitably used.

As the rubber-based polymer except the conjugated diene-based (co)polymer, for example, isobutylene (IB) or a styrene-isobutylene-styrene block copolymer (SIBS) may be used. The rubber-based polymers may be used alone or in combination thereof.

The rubber-based polymer that may be used in the present invention contains the conjugated diene-based (co)polymer at preferably 50 wt % or more, more preferably 70 wt % or more, still more preferably 80 wt % or more, particularly preferably 90 wt % or more in the entirety of the rubber-based polymer. An upper limit for the content of the conjugated diene-based (co)polymer is not particularly limited, and the content may be 100 wt % (i.e., the rubber-based polymer may be formed only of the conjugated diene-based (co)polymer).

As described above, the pressure-sensitive adhesive composition contains the rubber-based polymer as the base polymer. The content of the rubber-based polymer in the pressure-sensitive adhesive composition is preferably 40 wt % or more, more preferably 50 wt % or more, still more preferably 60 wt % or more. An upper limit for the content of the rubber-based polymer is not particularly limited, and the content is, for example, 90 wt % or less.

The pressure-sensitive adhesive composition may further contain any appropriate additive in addition to the rubber-based polymer. Specific examples of the additive include cross-linking agents (e.g., polyisocyanate, an epoxy compound, and an alkyl etherified melamine compound), tackifiers (e.g., a rosin derivative resin, a polyterpene resin, a petroleum resin, an oil-soluble phenol resin, and a vinyltoluene resin), plasticizers, fillers, and age inhibitors. The kinds, combination, addition amounts, and the like of the additives to be added to the pressure-sensitive adhesive composition may be appropriately set in accordance with purposes. The content (total amount) of the additives in the pressure-sensitive adhesive composition is preferably 60 wt % or less, more preferably 50 wt % or less, still more preferably 40 wt % or less.

The thickness of the pressure-sensitive adhesive layer 40 is, for example, from about 1 μm to about 300 μm, preferably from 1 μm to 200 μm, more preferably from 2 μm to 100 μm, still more preferably from 25 μm to 100 μm.

As described above, the pressure-sensitive adhesive layer 40 has a barrier property, and typically has barrier properties against moisture and a gas (e.g., oxygen). The water vapor transmission rate (moisture permeability) of the pressure-sensitive adhesive layer under the conditions of 40° C. and 90% RH when the thickness of the layer is 100 μm is preferably 200 g/m$^2$/24 hr or less, more preferably 150 g/m$^2$/24 hr or less, still more preferably 100 g/m$^2$/24 hr or less, particularly preferably 50 g/m$^2$/24 hr or less, most preferably 20 g/m$^2$/24 hr or less. A lower limit value for the water vapor transmission rate (moisture permeability) is preferably as low as possible, but in reality, is preferably 1 g/m$^2$/24 hr. When the water vapor transmission rate (moisture permeability) of the pressure-sensitive adhesive layer falls within such range, in the case where the circularly polarizing plate is bonded to an organic EL panel, the organic EL panel can be satisfactorily protected from moisture and oxygen in air by a synergistic effect with the barrier properties of the barrier layer.

A peeling film is preferably bonded to the surface of the pressure-sensitive adhesive layer until the layer is used. A reinforcing film to be described later may be bonded to one surface of the peeling film in advance in order to reduce the number of steps.

A-8. Protective Film

The protective film 50 is formed of any appropriate film that may be used as a protective layer for the polarizer. Specific examples of a material serving as a main component of the film include transparent resins, for example, a cellulose-based resin, such as triacetylcellulose (TAC), a polyester-based resin, a polyvinyl alcohol-based resin, a polycarbonate-based resin, a polyamide-based resin, a polyimide-based resin, a polyether sulfone-based resin, a polysulfone-based resin, a polystyrene-based resin, a polynorbornene-based resin, a polyolefin-based resin, a (meth)acrylic resin, and an acetate-based resin. Another example thereof is a thermosetting resin or a UV-curable resin, such as a (meth)acrylic resin, a urethane-based resin, a (meth)acrylic urethane-based resin, an epoxy-based resin, or a silicone-based resin. Still another example thereof is a glassy polymer, such as a siloxane-based polymer. In addition, a polymer film described in JP 2001-343529 A (WO 01/37007 A1) may also be used. As a material for the film, for example, there may be used a resin composition containing a thermoplastic resin having a substituted or unsubstituted imide group in a side chain and a thermoplastic resin having a substituted or unsubstituted phenyl group and a nitrile group in side chains. An example thereof is a resin composition containing an alternate copolymer formed of isobutene and N-methylmaleimide and an acrylonitrile-styrene copolymer. Such polymer film may be, for example, a product obtained by subjecting the resin composition to extrusion molding.

The glass transition temperature (Tg) of the (meth)acrylic resin is preferably 115° C. or more, more preferably 120° C. or more, still more preferably 125° C. or more, particularly preferably 130° C. or more because excellent durability can be obtained. An upper limit value for the Tg of the (meth)acrylic resin is not particularly limited, but is preferably 170° C. or less from the viewpoint of formability or the like.

Any appropriate (meth)acrylic resin may be adopted as the (meth)acrylic resin as long as the effects of the present invention are not impaired. Examples of the (meth)acrylic resin include poly(meth)acrylates, such as polymethyl methacrylate, a methyl methacrylate-(meth)acrylic acid copolymer, a methyl methacrylate-(meth)acrylate copolymer, a methyl methacrylate-acrylate-(meth)acrylic acid copolymer, a methyl (meth)acrylate-styrene copolymer (e.g., an MS resin), and a polymer having an alicyclic hydrocarbon group (e.g., a methyl metharylate-cyclohexyl methacrylate copolymer or a methyl methacrylate-norbornyl (meth)acrylate copolymer). Preferred examples thereof include poly($C_{1-6}$ alkyl (meth)acrylates), such as polymethyl (meth)acrylate. A more preferred example thereof is a methyl methacrylate-based resin containing methyl methacrylate as a main component (from 50 wt % to 100 wt %, preferably from 70 wt % to 100 wt %).

Specific examples of the (meth)acrylic resin include ACRYPET VH and ACRYPET VRL20A manufactured by Mitsubishi Rayon Co., Ltd., a (meth)acrylic resin having a ring structure in the molecule described in JP 2004-70296 A, and a (meth)acrylic resin with a high Tg obtained by intramolecular cross-linking or an intramolecular cyclization reaction.

The (meth)acrylic resin is particularly preferably a (meth)acrylic resin having a lactone ring structure because of having high heat resistance, high transparency, and high mechanical strength.

Examples of the (meth)acrylic resin having a lactone ring structure include (meth)acrylic resins each having a lactone ring structure described in JP 2000-230016 A, JP 2001-151814 A, JP 2002-120326 A, JP 2002-254544 A, and JP 2005-146084 A.

The mass-average molecular weight (sometimes referred to as weight-average molecular weight) of the (meth)acrylic resin having a lactone ring structure is preferably from 1,000 to 2,000,000, more preferably from 5,000 to 1,000,000, still more preferably from 10,000 to 500,000, particularly preferably from 50,000 to 500,000.

The glass transition temperature (Tg) of the (meth)acrylic resin having a lactone ring structure is preferably 115° C. or more, more preferably 125° C. or more, still more preferably 130° C. or more, particularly preferably 135° C. or more, most preferably 140° C. or more because excellent durability can be obtained. An upper limit value for the Tg of the (meth)acrylic resin having a lactone ring structure is not particularly limited, but is preferably 170° C. or less from the viewpoint of formability or the like.

The term "(meth)acrylic" as used herein refers to acrylic and/or methacrylic.

The protective film may be subjected to surface treatment, such as hard coat treatment, antireflection treatment, sticking prevention treatment, or antiglare treatment, as required. The thickness of the protective film is preferably 5 mm or less, more preferably 1 mm or less, still more preferably from 1 μm to 500 μm, particularly preferably from 5 μm to 150 μm.

When the inner protective film is adopted, it is preferred that the inner protective film be optically isotropic. The phrase "optically isotropic" as used herein means that the in-plane retardation Re(550) of the film is from 0 nm to 10 nm and the thickness direction retardation Rth(550) thereof is from −10 nm to +10 nm.

A-8. Method of Producing Circularly Polarizing Plate for Organic EL Display Apparatus Now, a method of producing the circularly polarizing plate for an organic EL display apparatus according to a typical embodiment of the present invention is described. The embodiment to be described below is a typical embodiment of the method of producing the circularly polarizing plate for an organic EL display apparatus of the present invention, and the method of producing the circularly polarizing plate for an organic EL display apparatus of the present invention is not limited thereto. This embodiment is a system involving continuously laminating the polarizer and the retardation layer by a roll-to-roll process, and allows the circularly polarizing plate for an organic EL display apparatus to be produced with extremely excellent production efficiency.

First, a retardation film constituting the retardation layer 20 is prepared. The retardation film is elongated and has a slow axis in a direction at a predetermined angle α relative to its longitudinal direction. The material, characteristics, production method, and the like of such retardation film are as described in the section A-4.

Next, as required, a reinforcing film is bonded to one surface of the retardation film through intermediation of a pressure-sensitive adhesive by the roll-to-roll process. Thus, a laminate of the retardation film and the reinforcing film is obtained. The reinforcing film having applied thereto the pressure-sensitive adhesive and the retardation film are typically bonded to each other by the roll-to-roll process.

Any appropriate material may be adopted as a material for the reinforcing film. Examples thereof include a plastic, paper, a metal film, and a nonwoven fabric. Of those, a plastic is preferred. The reinforcing film may include one kind of material, or may include two or more kinds of materials. For example, the film may include two or more kinds of plastics.

Examples of the plastic include a polyester-based resin, a polyamide-based resin, and a polyolefin-based resin. Examples of the polyester-based resin include polyethylene terephthalate, polybutylene terephthalate, and polyethylene naphthalate. Examples of the polyolefin-based resin include a homopolymer of an olefin monomer and a copolymer of an olefin monomer. Specific examples of the polyolefin-based resin include: homopolypropylenes; propylene-based copolymers, such as a block, random, or graft propylene-based copolymer having an ethylene component as a copolymerization component; Reactor-TPO; ethylene-based polymers of low density, high density, linear low density, or ultra low density; and ethylene-based copolymers, such as an ethylene-propylene copolymer, an ethylene-vinyl acetate copolymer, an ethylene-methyl acrylate copolymer, an ethylene-ethyl acrylate copolymer, an ethylene-butyl acrylate copolymer, an ethylene-methacrylic acid copolymer, and an ethylene-methyl methacrylate copolymer. Of those, a polyester-based resin is preferred and polyethylene terephthalate is more preferred. Such resin has high dimensional stability, high stiffness, and high heat resistance, and has an advantage in that the resin is excellent in general-purpose property from the viewpoint that the resin can be a subsidiary material.

The reinforcing film may contain any appropriate additive as required. Examples of the additive include an antioxidant, a UV absorber, a light stabilizer, an antistatic agent, a filler, and a pigment. The kinds, number, and amounts of the additives may be appropriately set in accordance with purposes. In particular, when the material for the reinforcing film is the plastic, two or more kinds of the additives are preferably incorporated for the purpose of, for example, preventing the deterioration of the film.

Any appropriate antioxidant may be adopted as the antioxidant. Examples of such antioxidant include a phenol-based antioxidant, a phosphorus-based processing heat stabilizer, a lactone-based processing heat stabilizer, a sulfur-based heat stabilizer, and a phenol-phosphorus-based antioxidant. The content of the antioxidant is preferably 1 part by weight or less, more preferably 0.5 part by weight or less, still more preferably from 0.01 part by weight to 0.2 part by weight with respect to 100 parts by weight of the base resin of the reinforcing film (when the reinforcing film is a blend, the blend is the base resin).

Any appropriate UV absorber may be adopted as the UV absorber. Examples of such UV absorber include a benzotriazole-based UV absorber, a triazine-based UV absorber, and a benzophenone-based UV absorber. The content of the UV absorber is preferably 2 parts by weight or less, more preferably 1 part by weight or less, still more preferably from 0.01 part by weight to 0.5 part by weight with respect to 100 parts by weight of the base resin of the reinforcing film.

Any appropriate light stabilizer may be adopted as the light stabilizer. Examples of such light stabilizer include a hindered amine-based light stabilizer and a benzoate-based light stabilizer. The content of the light stabilizer is preferably 2 parts by weight or less, more preferably 1 part by weight or less, still more preferably from 0.01 part by weight to 0.5 part by weight with respect to 100 parts by weight of the base resin of the reinforcing film.

Any appropriate filler may be adopted as the filler. Such filler is, for example, an inorganic filler. Specific examples of the inorganic filler include carbon black, titanium oxide, and zinc oxide. The content of the filler is preferably 20 parts by weight or less, more preferably 10 parts by weight or less, still more preferably from 0.01 part by weight to 10 parts by weight with respect to 100 parts by weight of the base resin forming the reinforcing film (when the reinforcing film is a blend, the blend is the base resin).

Further, preferred examples of the additive include inorganic, low-molecular weight-type, and high-molecular weight-type antistatic agents intended to impart antistatic properties, such as a surfactant, an inorganic salt, a polyhydric alcohol, a metal compound, and carbon. Of those, a high-molecular weight-type antistatic agent or carbon is particularly preferred from the viewpoints of the prevention of the contamination of the film and the maintenance of the pressure-sensitive adhesive property thereof.

Any appropriate thickness may be adopted as the thickness of the reinforcing film. The thickness of the reinforcing film is preferably from 5 µm to 300 µm, more preferably from 10 µm to 250 µm, still more preferably from 15 µm to 200 µm, particularly preferably from 20 µm to 150 µm. Further, the total thickness of the reinforcing film and the pressure-sensitive adhesive to be described later is preferably from 1 time to 4 times as large as the thickness of the retardation film.

The reinforcing film may be a single layer, or may be a laminate of two or more layers.

The product (GPa·µm) of the tensile modulus of elasticity (GPa) at 23° C. and thickness (µm) of the reinforcing film is preferably from 20 to 500, more preferably from 30 to 300. The value may be controlled by adjusting the kinds and amounts of the formation material and additive of the reinforcing film, and when the reinforcing film is a laminate, a ratio between the thicknesses of the respective layers. When the product is less than 20 (GPa·µm), the tensility of the reinforcing film is insufficient and hence a wrinkle occurs at the time of its lamination with the retardation film to impair the appearance of the circularly polarizing plate in some cases. When the product is more than 500 (GPa·µm), the tensility of the reinforcing film is so strong that a handling property at the time of its peeling from the retardation film becomes insufficient in some cases.

The linear expansion coefficient of the reinforcing film is preferably as small as possible. The linear expansion coefficient is preferably from 5 ppm/° C. to 50 ppm/° C., more preferably from 10 ppm/° C. to 30 ppm/° C. The ratio at which the dimensions of the reinforcing film are changed by heating is also preferably as small as possible. For example, a dimensional change ratio after heating at 180° C. for 5 minutes is preferably from 0.1% to 5.0%, more preferably from 0.5% to 3.0%. When a reinforcing film having a small linear expansion coefficient and/or a small dimensional change ratio by heating is used, even under a high-temperature environment in a barrier layer-forming process, the dimensional change of the retardation film can be suppressed and hence a change in orientation of a molecule in the film can be alleviated. As a result, the optical characteristics (e.g., a slow axis direction and a retardation value) of the retardation film can be satisfactorily maintained.

In one embodiment, the reinforcing film is stretched. Stretching conditions may vary depending on purposes, a desired linear expansion coefficient, and the like. A stretching ratio is preferably from 1.5 times to 10 times, more preferably from 3.0 times to 5.0 times. A stretching temperature is preferably from the glass transition temperature (Tg) of the reinforcing film to a temperature higher than the Tg by 50° C. (Tg+50° C.). The stretching is preferably biaxial stretching. This is because the anisotropy of each of thermal properties and mechanical properties in the plane of the film can be alleviated. A method for the biaxial stretching may be any one of a tenter simultaneous biaxial stretching method, and a sequential biaxial stretching method based on a roll and a tenter. A tubular method may also be used.

Any appropriate pressure-sensitive adhesive may be used as the pressure-sensitive adhesive for the reinforcing film. Specific examples of the base polymer of the pressure-sensitive adhesive include a (meth)acrylic polymer, a rubber-based polymer, a silicone-based polymer, a polyurethane-based polymer, and a polyester-based polymer. The pressure-sensitive adhesive preferably contains a (meth) acrylic polymer having, as a main component (monomer unit), a (meth)acrylic acid alkyl ester having an alkyl group having 1 to 20 carbon atoms. The term "main component" means a monomer having the highest constituent ratio out of the monomer units (components) constituting the (meth) acrylic polymer. Details about such pressure-sensitive adhesive are described in, for example, JP 2014-141649 A, and the corresponding description is incorporated herein by reference.

In an embodiment in which the retardation film and the barrier layer are directly laminated (hereinafter referred to as "embodiment (A)"), next, the barrier layer is formed on the retardation film surface (when the reinforcing film is present, the retardation film surface of the laminate of the retardation film and the reinforcing film). Specifically, the barrier layer is bonded to the retardation film surface (when the reinforcing film is present, the retardation film surface of the laminate of the retardation film and the reinforcing film) using an adhesive. As the adhesive, for example, a UV-curable adhesive or a thermosetting adhesive may be used, and a UV-curable adhesive is preferred in terms of productivity and characteristics. Any appropriate adhesive may be adopted as the kind of the adhesive to the extent that the effects of the present invention are not impaired. Examples of such adhesive include an epoxy-based adhesive, an acrylic adhesive, and a thiol-based adhesive. Any appropriate thickness may be adopted as the thickness of an adhesive layer formed of the adhesive to the extent that the effects of the present invention are not impaired. Such thickness is preferably from 0.01 µm to 10 µm.

Next, when the circularly polarizing plate for an organic EL display apparatus of the present invention includes the conductive layer or the isotropic substrate with a conductive layer between the barrier layer and the pressure-sensitive adhesive layer, the conductive layer or the isotropic substrate with a conductive layer is arranged on the barrier layer surface in the embodiment (A). Specifically, the conductive layer or the isotropic substrate with a conductive layer may be formed by, for example, forming a metal oxide film on the barrier layer surface by any appropriate film formation method (e.g., a vacuum deposition method, a sputtering method, a CVD method, an ion plating method, or a spraying method).

When the circularly polarizing plate for an organic EL display apparatus of the present invention includes the conductive layer or the isotropic substrate with a conductive layer between the retardation film and the barrier layer, the conductive layer or the isotropic substrate with a conductive layer is arranged on the retardation film surface (when the reinforcing film is present, the retardation film surface of the laminate of the retardation film and the reinforcing film). Specifically, the conductive layer or the isotropic substrate with a conductive layer may be formed by, for example, forming a metal oxide film on the retardation film by any appropriate film formation method (e.g., a vacuum deposition method, a sputtering method, a CVD method, an ion plating method, or a spraying method). After that, the barrier layer is bonded to the surface of the conductive layer or the isotropic substrate with a conductive layer using an adhesive. As the adhesive, for example, a UV-curable adhesive or a thermosetting adhesive may be used, and a UV-curable adhesive is preferred in terms of productivity and characteristics. Any appropriate adhesive may be adopted as the kind of the adhesive to the extent that the effects of the present invention are not impaired. Examples of such adhesive include an epoxy-based adhesive, an acrylic adhesive, and a thiol-based adhesive. Any appropriate thickness may be adopted as the thickness of an adhesive layer formed of the adhesive to the extent that the effects of the present invention are not impaired. Such thickness is preferably from 0.01 µm to 10 µm.

Thus, an optical laminate (intermediate for a circularly polarizing plate) including the retardation layer and the barrier layer is produced. As is apparent from the foregoing description, the optical laminate in this embodiment is elongated (roll shape in the described example). As described above, when a specific retardation film is used in combination with a specific reinforcing film as required, the barrier layer can be formed on the surface of the retardation film obtained by the oblique stretching while the optical characteristics and mechanical characteristics of the film are maintained. Therefore, the retardation film having formed thereon the barrier layer can be subjected to the roll-to-roll process. That is, the optical laminate thus obtained is one result actually obtained in the present invention, and is one means for achieving the circularly polarizing plate of the present invention and an excellent effect thereof.

Next, as required, the reinforcing film is peeled from the optical laminate, and the polarizer is bonded to the peeled surface by the roll-to-roll process. In one embodiment, the laminate of the barrier layer and the retardation film obtained by peeling the reinforcing film, and a polarizing plate (laminate of the polarizer and the protective film) are bonded to each other by the roll-to-roll process so that the polarizer may be adjacent to the retardation film. In another embodiment, the laminate of the barrier layer and the retardation film, the polarizer, and the protective film are collectively bonded to each other by the roll-to-roll process. In still another embodiment, the laminate of the barrier layer and the retardation film, and the polarizer are bonded to each other by the roll-to-roll process, and then the protective film is bonded to the resultant by the roll-to-roll process. The polarizing plate or the polarizer is elongated (roll shape in the described example), and has an absorption axis in its longitudinal direction. In the embodiment of the present invention, as described above, the barrier layer can be formed on the retardation film having the slow axis in an oblique direction (direction at an angle α relative to its longitudinal direction), and hence lamination by the roll-to-roll process can be performed by using a polarizer obtained by typical longitudinal uniaxial stretching.

Finally, the pressure-sensitive adhesive layer is formed on the surface of the barrier layer. The pressure-sensitive adhesive constituting the pressure-sensitive adhesive layer is as described in the section A-6.

Thus, the circularly polarizing plate for an organic EL display apparatus of the present invention is obtained.

The circularly polarizing plate for an organic EL display apparatus of the present invention may be produced by a so-called batch system. That is, the retardation film having formed thereon the barrier layer and the polarizing plate (laminate of the polarizer and the protective film) may be bonded to each other after having been cut into predetermined sizes. Alternatively, the retardation film having formed thereon the barrier layer, the polarizer, and the protective film may be bonded to each other after having been cut into respective predetermined sizes. The batch system eliminates the need for the control of the angle between the absorption axis of the polarizer and the slow axis of the retardation film in a roll state, and hence a retardation film obtained by longitudinal stretching or lateral stretching can be used.

B. Organic EL Display Apparatus

An organic EL display apparatus of the present invention includes the circularly polarizing plate for an organic EL display apparatus described in the section A on its viewer side. The circularly polarizing plate for an organic EL display apparatus is laminated so that the pressure-sensitive adhesive layer may be positioned on an organic EL panel side (the polarizer may be positioned on the viewer side).

EXAMPLES

The present invention is specifically described below by way of Examples. However, the present invention is not limited by these Examples.

<<Evaluation Item>>

<Light Emission Deterioration Evaluation>

An organic EL device (light-emitting surface: 2 mm□) was produced on a glass substrate. After that, a circularly polarizing plate for an organic EL display apparatus obtained in each of Examples and Comparative Examples was laminated thereon, and light emission deterioration of the device was observed. The light emission deterioration was judged by whether the device had a half time of 500 hours or more when stored under an environment at 60° C. and 90% RH on the basis of the half-life of its brightness. A case in which the half time was 500 hours or more was marked with symbol "○", and a case in which the half time was less than 500 hours was marked with symbol "x".

Production Example 1

(Production of Polarizer)

An elongate polyvinyl alcohol film was dyed in an aqueous solution containing iodine, and was then uniaxially stretched at 6 times in an aqueous solution containing boric acid between rolls having different speed ratios to provide an elongate polarizer having an absorption axis in its lengthwise direction. After the stretching, the elongate polarizer was rolled into a roll body.

Production Example 2

(Preparation of Protective Film)

An elongate triacetylcellulose film (thickness: 40 μm, manufactured by Konica Minolta, Inc., product name: KC4UYW) was used as a protective film. The protective film was prepared as a roll body. The protective film had an in-plane retardation Re(550) of 5 nm, and a thickness direction retardation Rth(550) of 45 nm.

Production Example 3

(Preparation of Retardation Film)

A commercially available retardation film showing reverse wavelength dispersion dependency (manufactured by Teijin Limited, product name: "PURE-ACE WR") was used. The retardation film had an in-plane retardation Re (550) of 147 nm, a ratio Re(450)/Re(550) of 0.89, and a photoelastic coefficient of $65 \times 10^{-12}$ $Pa^{-1}$ ($m^2/N$).

Production Example 4

(Preparation of Thin Glass)

Thin glass having a thickness of 50 μm (manufactured by Nippon Electric Glass Co., Ltd., product name: OA-10) was adopted.

Production Example 5

(Production of Isotropic Substrate with Conductive Layer)

A polycycloolefin film having curable resin layers formed on both surfaces thereof was loaded into a take-up sputtering device, and an amorphous indium tin oxide layer (transparent electrode film) having a thickness of 27 nm was formed on the surface of one of the curable resin layers.

After that, the polycycloolefin film having formed thereon the indium tin oxide layer (transparent electrode film) was loaded into an air circulating oven in a roll-to-roll manner, and was subjected to heating treatment at 130° C. for 90 minutes to convert the transparent electrode film from being amorphous to being crystalline. Thus, a transparent conductive film including a transparent electrode film having a surface resistance value of 100Ω/□ (isotropic substrate with a conductive layer) was obtained.

Production Example 6

(Preparation of Pressure-Sensitive Adhesive Layer)

An acrylic pressure-sensitive adhesive (water vapor transmission rate: 1,000 $g/m^2$/day) and rubber-based pressure-sensitive adhesives (50 $g/m^2$/day) each having a thickness of 100 μm were prepared as materials for a pressure-sensitive adhesive layer. Each of those pressure-sensitive adhesives was in a state of being sandwiched between separators, and was trimmed to a size of 50 mm×80 mm.

Example 1

The polarizer obtained in Production Example 1, the protective film obtained in Production Example 2, and the retardation film obtained in Production Example 3 were each cut to a size of 200 mm×300 mm. The polarizer and the protective film were bonded to each other through intermediation of a polyvinyl alcohol-based adhesive. The laminate of the polarizer and the protective film, and the retardation film were bonded to each other through intermediation of an acrylic pressure-sensitive adhesive layer so that the polarizer and the retardation film were adjacent to each other. Thus, a circularly polarizing plate having a configuration "protective film/polarizer/retardation film (first retardation film)" was produced. After that, the produced circularly polarizing plate was trimmed to a size of 50 mm×80 mm. The retardation film was cut so that its slow axis and the absorption axis of the polarizer formed an angle of 45° at the time of their bonding. In addition, the absorption axis of the polarizer was arranged so as to be parallel to a lengthwise direction.

Next, the circularly polarizing plate and the isotropic substrate with a conductive layer obtained in Production Example 5 were bonded to both surfaces of the thin glass (40 mm×70 mm) prepared in Production Example 4 through intermediation of adhesive layers (thickness: 5 µm) each formed of an acrylic adhesive, and UV light was applied to cure the adhesive. In this case, the lamination configuration was such that the polarizer and the transparent conductive film served as external surfaces for the thin glass.

Subsequently, the rubber-based pressure-sensitive adhesive layer having a water vapor transmission rate of 50 g/m$^2$/day prepared in Production Example 6 was laminated on the surface of the isotropic substrate with a conductive layer. Specifically, one of the separators of the pressure-sensitive adhesive layer was peeled off, and the peeled surface and the isotropic substrate with a conductive layer were bonded to each other.

Thus, a circularly polarizing plate (1) for an organic EL display apparatus formed of a configuration "polarizer/protective film/retardation film/thin glass/isotropic substrate with a conductive layer/pressure-sensitive adhesive layer" was obtained. The result is shown in Table 1.

Example 2

The polarizer obtained in Production Example 1, the protective film obtained in Production Example 2, and the retardation film obtained in Production Example 3 were each cut to a size of 200 mm×300 mm. The polarizer and the protective film were bonded to each other through intermediation of a polyvinyl alcohol-based adhesive. The laminate of the polarizer and the protective film, and the retardation film were bonded to each other through intermediation of an acrylic pressure-sensitive adhesive layer so that the polarizer and the retardation film were adjacent to each other. Thus, a circularly polarizing plate having a configuration "protective film/polarizer/retardation film (first retardation film)" was produced. After that, the produced circularly polarizing plate was trimmed to a size of 50 mm×80 mm. The retardation film was cut so that its slow axis and the absorption axis of the polarizer formed an angle of 45° at the time of their bonding. In addition, the absorption axis of the polarizer was arranged so as to be parallel to a lengthwise direction.

Next, the circularly polarizing plate was bonded to the surface of the isotropic substrate with a conductive layer obtained in Production Example 5 opposite to the conductive layer through intermediation of an adhesive layer (thickness: 5 µm) formed of an acrylic adhesive. Thus, a laminate was obtained.

Next, the thin glass prepared in Production Example 4 and a side of the isotropic substrate with a conductive layer of the laminate were bonded to each other through intermediation of an adhesive layer (thickness: 5 µm) formed of an acrylic adhesive, and UV light was applied to cure the adhesive.

Subsequently, the rubber-based pressure-sensitive adhesive layer having a water vapor transmission rate of 50 g/m$^2$/day prepared in Production Example 6 was laminated on the surface of the thin glass. Specifically, one of the separators of the pressure-sensitive adhesive layer was peeled off, and the peeled surface and the isotropic substrate with a conductive layer were bonded to each other.

Thus, a circularly polarizing plate (2) for an organic EL display apparatus formed of a configuration "polarizer/protective film/retardation film/isotropic substrate with a conductive layer/thin glass/pressure-sensitive adhesive layer" was obtained.

The result is shown in Table 1.

Comparative Example 1

A circularly polarizing plate (IC) for an organic EL display apparatus was obtained in the same manner as in Example 1 except that a PET substrate having the same thickness was used in place of the thin glass.

The result is shown in Table 1.

Comparative Example 2

A circularly polarizing plate (2C) for an organic EL display apparatus was obtained in the same manner as in Example 2 except that an acrylic pressure-sensitive adhesive having a water vapor transmission rate of 1,000 g/m$^2$/day was used in place of the rubber-based pressure-sensitive adhesive layer having a water vapor transmission rate of 50 g/m$^2$/day.

The result is shown in Table 1.

TABLE 1

|  | Example 1 | Example 2 | Comparative Example 1 | Comparative Example 2 |
| --- | --- | --- | --- | --- |
| Result of light emission deterioration evaluation | ○ | ○ | x | x |

INDUSTRIAL APPLICABILITY

The circularly polarizing plate for an organic EL display apparatus of the present invention is suitably used for an organic EL display apparatus.

REFERENCE SIGNS LIST 10 polarizer
20 retardation layer
30 barrier layer
40 pressure-sensitive adhesive layer
50 protective film
100 circularly polarizing plate for organic EL display apparatus

The invention claimed is:
1. A circularly polarizing plate for an organic EL display apparatus, comprising in this order:
   a polarizer;
   a retardation layer, which is configured to function as a λ/4 plate;
   a barrier layer; and
   a pressure-sensitive adhesive layer, which has a barrier function,
   wherein the barrier layer comprises thin glass having a thickness of from 5 µm to 100 µm, and
   a water vapor transmission rate of the pressure-sensitive adhesive layer under conditions of 40° C. and 90% relative humidity when a thickness of the pressure-sensitive adhesive layer is 100 µm is 200 g/m$^2$/24 hours or less.

2. The circularly polarizing plate for an organic EL display apparatus according to claim 1, further comprising a conductive layer or an isotropic substrate with a conductive layer between the barrier layer and the pressure-sensitive adhesive layer.

3. The circularly polarizing plate for an organic EL display apparatus according to claim 1, further comprising a conductive layer or an isotropic substrate with a conductive layer between the retardation layer and the barrier layer.

4. An organic EL display apparatus, comprising the circularly polarizing plate for an organic EL display apparatus of claim 1.

* * * * *